(12) United States Patent
Shiraishi et al.

(10) Patent No.: US 6,873,090 B2
(45) Date of Patent: Mar. 29, 2005

(54) PIEZOCOMPOSITE, ULTRASONIC PROBE FOR ULTRASONIC DIAGNOSTIC EQUIPMENT, ULTRASONIC DIAGNOSTIC EQUIPMENT, AND METHOD FOR PRODUCING PIEZOCOMPOSITE

(75) Inventors: Seigo Shiraishi, Osaka (JP); Norihisa Takahara, Osaka (JP); Emiko Igaki, Hyogo (JP); Hidetomo Nagahara, Kyoto (JP); Koetsu Saito, Tokyo (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 10/055,640

(22) Filed: Jan. 22, 2002

(65) Prior Publication Data

US 2002/0130590 A1 Sep. 19, 2002

(30) Foreign Application Priority Data

Jan. 25, 2001 (JP) .................................. 2001-017559
Jun. 11, 2001 (JP) .................................. 2001-176026

(51) Int. Cl.$^7$ .......................... H01L 41/08; H01L 41/24
(52) U.S. Cl. .................................. 310/334; 29/25.35
(58) Field of Search ..................... 310/334; 29/35.25

(56) References Cited

U.S. PATENT DOCUMENTS

| 4,514,247 A | | 4/1985 | Zola ........................... 29/25.35 |
| 4,572,981 A | | 2/1986 | Zola ............................ 310/357 |
| 4,683,396 A | | 7/1987 | Takeuchi et al. .............. 310/358 |
| 5,175,709 A | * | 12/1992 | Slayton et al. ............... 310/358 |
| 5,237,239 A | * | 8/1993 | Inoue et al. .................. 310/328 |
| 5,340,510 A | | 8/1994 | Bowen ......................... 264/22 |
| 5,539,965 A | * | 7/1996 | Safari et al. ................ 29/25.35 |

FOREIGN PATENT DOCUMENTS

| DE | 3437 862 | 5/1985 | |
| EP | 0 642 036 | 3/1995 | ........... G01S/15/69 |
| JP | 58-21883 | 2/1983 | ........... H01L/41/22 |
| JP | 60-85699 | 5/1985 | ........... H04R/17/00 |
| JP | 61-195000 | 8/1986 | ........... H04R/17/00 |
| JP | 2-51289 | 2/1990 | ........... H01L/41/26 |
| JP | 2924664 | 5/1999 | ........... H01L/41/24 |
| JP | 11-274592 | 10/1999 | ........... H01L/41/09 |

OTHER PUBLICATIONS

*Ultrasonic Wave Handbook*, Section 3.3.10a, Maruzen Kabushiki Kaisha (1999).
Smith, W.A., "The role of piezocomposites in ultrasonic tranducers," *Ultrasonics Symposium*, 755–766 (1989).
"Composite Piezoelectric Materials for Medical Ultrasonic Imaging Transducers–A Review" by Wallace Arden Smith, ISAF '86. Proceedings of the Sixth IEEE International Symposium on Applications of Ferroelectrics, pp. 249–256 (1986).
European Search Report for Application EP 02001590 dated May 6, 2004.

* cited by examiner

*Primary Examiner*—Darren Schuberg
*Assistant Examiner*—J. Aguirrechea
(74) *Attorney, Agent, or Firm*—Merchant & Gould P.C.

(57) ABSTRACT

A composite sheet unit in which a plurality of sintered piezoelectric thin wires are arranged in a uniform direction on a surface of a resin layer is prepared, and a plurality of the same are laminated and integrated so that the sintered piezoelectric thin wires are positioned between the resin layers. Here, a curing resin may be impregnated therein so as to form resin-impregnated-cured portions. Then, the lamination is cut in a direction crossing a lengthwise direction of the sintered piezoelectric thin wires, so that a piezocomposite is obtained. Cut surfaces may be ground. By so doing, it is possible to provide a highly reliable piezocomposite having a fine structure at low cost, and to provide an ultrasonic probe for ultrasonic diagnostic equipment, as well as ultrasonic diagnostic equipment using the same.

15 Claims, 20 Drawing Sheets

PIEZOCOMPOSITE, ULTRASONIC PROBE FOR ULTRASONIC DIAGNOSTIC EQUIPMENT, ULTRASONIC DIAGNOSTIC EQUIPMENT, AND METHOD FOR PRODUCING PIEZOCOMPOSITE

BACKGROUND OF THE INVENTION

1. Field of the Invention

The present invention relates to a piezocomposite having a ceramic structure in a fine structure form, to an ultrasonic probe for ultrasonic diagnostic equipment, to ultrasonic diagnostic equipment using the probe, and to a method for producing the piezocomposite.

2. Related Background Art

Conventionally, an attempt has been made to substitute a piezocomposite made of a piezoelectric ceramic and an organic polymer for a piezoelectric ceramic as an ultrasonic transmitting/receiving part in an ultrasonic probe for use in medical ultrasonic diagnostic equipment, with a view to providing a higher resolution and a broader bandwidth for the ultrasonic probe. Among such piezocomposites, a piezoelectric material that has attracted attention (hereinafter referred to as 1-3 piezocomposite) has a structure in which a multiplicity of piezoelectric ceramics 31 in cylindrical or prismatic shapes (for instance, quadratic prism) are arranged in a matrix made of an organic polymer 41 as shown in FIG. 24. This has been found to be useful theoretically, thereby resulting in that production of the same has been attempted. The prior art concerning these 1-3 piezocomposites is disclosed in, for instance, "Cho-onpa Binran (Ultrasonic Wave Handbook)" edited by Cho-onpa Binran Editing Committee, Maruzen, and published on Aug. 30, 1999, pp. 129–133, etc.

Though the usefulness of the 1-3 piezocomposite has been recognized, there have been few commercially available commodities of the 1-3 piezocomposite as actual ultrasonic probes for ultrasonic diagnostic equipments. Two of the main reasons for the same are: (1) that an extremely fine structure is required, and its production is very difficult; and (2) that, even if manufacture is possible, the production cost is very high.

It is considered that the piezocomposite for use in the ultrasonic diagnostic equipment ideally has a configuration in which the piezoelectric ceramics have a diameter and an interval therebetween of approximately 10 to 200 $\mu$m each, which is derived from a frequency used and an acoustic impedance of the piezocomposite. On the other hand, it is said that the best transmission/reception efficiency is obtained in the case where a ratio between a diameter and a length (length/diameter, hereinafter referred to as "aspect ratio") of a prismatic piezoelectric ceramic is set to approximately 5 to 6. In other words, the piezoelectric ceramic in the piezocomposite is required to have a length of approximately 50 $\mu$m to 1200 $\mu$m.

Considering the foregoing together, the most desirable piezocomposite would have an extremely fine structure in which a plurality of fine piezoelectric ceramics, each of which is in a thin line form with a diameter of several tens $\mu$m and an aspect ratio of approximately 6, are provided in an organic polymer matrix, and it is demanded in the market.

As an example of the prior art techniques concerning the method for producing a piezocomposite, a method for producing the 1-3 piezocomposite is proposed by JP 1789409 and JP 1590342 in which a plurality of cut grooves are formed by machining in a piezoelectric ceramic block used as a material, and a resin is impregnated in the cut grooves and cured.

Furthermore, a production method in which laser processing is carried out instead of the conventional cutting technique such as dicing is proposed by JP 5(1993)-33836 B. In the foregoing known example, a laser beam is scanned thereover so that parallel cuts in two directions that cross each other are formed in the piezoelectric ceramic. By so doing, a piezoelectric ceramic structure having a fine structure is provided, and thereafter, a resin is impregnated in void portions and cured.

However, in such methods in which cut grooves are formed directly in a relatively large piezoelectric ceramic block by dicing or laser processing so as to provide an aggregate of fine sintered piezoelectric pieces, there is a drawback in that it is difficult to form a desired shape, or even if it is possible, only a low manufacturing yield is obtained and the production cost increases. With the present machining technique, considering a case where cut grooves with a width of several tens $\mu$m are formed in a ceramic block, the yield more rapidly decreases as the aspect ratio increases, or in other words, as the depth of the cut grooves increases. This is because the piezoelectric ceramic tends to be broken more often as the piezoelectric ceramic obtained (remaining) after cutting the cut grooves is thinner. In the case where even only a few of fine sintered piezoelectric pieces in a piezocomposite formed in an intended shape are damaged, this may make the entire piezocomposite defective. Therefore, it is very difficult to produce a piezocomposite having the aforementioned currently required shape by the conventional method in which cut grooves are formed by machining.

Furthermore, since it is difficult to directly process a ceramic by machining such as cutting or laser processing, a plurality of methods have been proposed in which a sintered piezoelectric ceramic having a required structure is formed using a mold having a shape reverse to the required structure, and thereafter, a resin is impregnated in void portions and cured.

For instance, the following method for obtaining a piezocomposite is proposed. Namely, the foregoing mold is formed with a resin, and a ceramic slurry is filled in the resin mold, then, the resin mold is burned out so that a structure made of only a ceramic powder is formed, and further, the ceramic powder is sintered. By so doing, a sintered piezoelectric ceramic having a fine structure, and finally a resin is impregnated in void portions and cured, whereby a piezocomposite is obtained.

However, it is not easy to burn out the resin mold so as to leave only the ceramic powder before sintering. Upon the burning out of the resin mold, the resin flows, thereby breaking the ceramic powder structure before sintering. Furthermore, as the structure is made finer, the difficulty in burning out the resin mold increases.

Therefore, as a method for causing only the resin to disappear without damaging the ceramic powder structure before sintering, JP 2924664 has proposed the heating in vacuum, the laser abrasion, the plasma etching, and the use of a low-viscosity solvent.

Furthermore, as another method, JP 11(1999)-274592 Ahas proposed a method in which a mold is made of a silicon material that is not burned out when the ceramic is sintered, and after sintering the ceramic structure, only the mold is removed. More specifically, a plurality of fine holes are formed in a silicon material by ion etching, a slurry made of a piezoelectric powder and a binder is applied to the holes and dried so that the binder is removed therefrom, the obtained matter is covered with a protective ceramic powder and is sintered while pressurized, then, the protective ceramic powder is removed after the sintering, and finally, the silicon material is removed by etching. In other words, it is a method in which a mold having a shape reverse to a required structure is made of a material that is not burned out at a temperature at which a ceramic is sintered, and after sintering the ceramic powder structure, the mold is removed by etching.

These methods, however, are complexity, and need complex steps and a long time for making the mold disappear, thereby unavoidably leading to an increase in the production cost. Furthermore, manufacturing devices used therein are expensive. Moreover, in a method utilizing a resin mold having a shape reverse to a required structure, that is, both of the method utilizing a resin mold and the method utilizing a silicon material, the mold has to be made to disappear with certainty. The cost of manufacturing the mold and the cost of raw materials for the mold result in an increase in the cost of manufacturing the piezocomposite as a final product.

Another method is a method in which a plurality of sintered piezoelectric ceramics, each of which is in a rod shape, are prepared beforehand, and they are arranged and integrated, whereby a piezocomposite is produced, which has been proposed by Wallace Arden Smith, in "The Role of Piezocomposites in Ultrasonic Transducers", Proceedings of the 1989 IEEE Ultrasonic Symposium, pp. 755–766, 1989.

However, the method in which sintered piezoelectric ceramics, each in a rod shape, are prepared beforehand and arranged later on has a drawback in that the handling of the sintered piezoelectric alone is more difficult as the sintered piezoelectric in an object piezocomposite has a finer structure, thereby making the production difficult, or even if the production is possible, decreasing the yield, which results in an increase in the production cost.

As another method, the following method has been disclosed in U.S. Pat. No. 4,514,347 and U.S. Pat. No. 4,572,981. Sintered ceramic plates are laminated and integrated using another material so as to form a block, and a sheet obtained by slicing the block is prepared as a first stratum. Then, the sheets are laminated and integrated again using another material that forms a second stratum, and the lamination is sliced, so that a 1-3 piezocomposite is obtained.

The foregoing method, however, is not capable of avoiding the continuous cutting through a distance longer than the length of sintered piezoelectric thin wires in a piezocomposite as a final object, when the lamination block is cut to obtain the first stratum. Therefore, likewise, there is a drawback in that the production is difficult, or even if it is possible, the yield is not sufficient, which causes the manufacturing cost to increase.

Thus, by the conventional methods that have been proposed or experimented so far, the production of piezocomposite having a fine structure that is demanded currently is difficult, or even if it is possible, it requires a high production cost.

Furthermore, there is another problem in that in the conventional techniques, a material that is impregnated in void portions of a sintered piezoelectric is limited to one kind because of the production method, and consequently, it is difficult to adjust physical properties of an obtained piezocomposite freely.

Considering the foregoing conventional techniques in detail, the inventors of the present invention concluded that in order to obtain a piezocomposite having a shape required in the market currently, it is necessary to realize at the same time the production of extremely fine sintered piezoelectric pieces with a high yield and the arrangement of the produced fine sintered piezoelectric pieces with high precision.

SUMMARY OF THE INVENTION

Therefore, with the foregoing in mind, it is an object of the present invention to provide a piezocomposite having a fine structure and desired physical properties at low cost, and to provide a high-performance and low-cost ultrasonic diagnostic equipment and ultrasonic probe for use in the same, by utilizing the foregoing piezocomposite.

To achieve the foregoing object, a piezocomposite of the present invention is obtained by laminating and integrating a plurality of composite sheet units, each of which includes a resin layer and a plurality of sintered piezoelectric thin wires arranged in a uniform direction on a surface of the resin layer, so that the sintered piezoelectric thin wires are positioned between the resin layers, and cutting the same in a direction perpendicular to a lengthwise direction of the sintered piezoelectric thin wires. An ultrasonic probe for use in an ultrasonic diagnostic equipment of the present invention includes:

the foregoing piezocomposite, with electrodes provided on both sides of the piezocomposite;

an acoustic matching layer; and a backing member, wherein:

the piezocomposite is interposed between the acoustic matching layer and the backing member; and one of the electrodes is grounded, while the other electrode is connected as a driving electrode with a transmitting/receiving circuit.

An ultrasonic diagnostic equipment of the present invention is characterized in that the foregoing ultrasonic probe for use in an ultrasonic diagnostic equipment is connected with an ultrasonic diagnostic equipment main body that includes:

a transmitting section and a receiving section that are connected with lines lead from the electrodes on the both sides;

a controlling section connected with the transmitting section and the receiving section;

an image forming section connected with the receiving section and the controlling section; and an image display device connected with the image forming section.

A first piezocomposite production method of the present invention includes the steps of:

(a) preparing a molding substrate having a plurality of grooves;

(b) applying to the grooves a paste including a piezoelectric powder and a binder, drying the same, and heating the same so as to remove the binder from a coating film made of the paste;

(c) applying a heat treatment at a higher temperature to sinter the piezoelectric powder, so as to form sintered piezoelectric thin wires;

(d) bonding a resin layer on the sintered piezoelectric thin wires and separate the sintered piezoelectric thin wires from the molding substrate, so as to form a composite sheet unit in which a plurality of the sintered piezoelectric thin wires are arranged in a uniform direction on one surface of the resin layer;

(e) laminating a plurality of the composite sheet units so that the sintered piezoelectric thin wires are positioned between the resin layers; and (f) integrating the plurality of the composite sheet units thus laminated.

A second piezocomposite production method of the present invention includes the steps of:

(a) preparing a sintered piezoelectric plate having a thickness ranging from 10 $\mu$m to 500 $\mu$m;

(b) forming a resin layer on the sintered piezoelectric plate;

(c) forming a plurality of parallel cut grooves in the sintered piezoelectric plate provided with the resin layer, without completely dividing the resin layer, so as to cut the sintered piezoelectric plate into a plurality of sintered piezoelectric thin wires;

(d) repeating the steps (a) to (c) a plurality of times, so as to prepare a plurality of composite sheet units on a surface of each of which a plurality of the sintered piezoelectric thin wires are arranged in a uniform direction;

(e) laminating a plurality of the composite sheet units so that the sintered piezoelectric thin wires are positioned between the resin layers; and (f) integrating the plurality of the composite sheet units thus laminated.

A third piezocomposite production method of the present invention includes the steps of:

(a) preparing a sintered piezoelectric plate having a thickness ranging from 10 $\mu$m to 500 $\mu$m;

(b) provisionally fixing the sintered piezoelectric plate on a substrate, by using an adhesive sheet;

(c) forming a plurality of parallel cut grooves in the sintered piezoelectric plate so as to cut the sintered piezoelectric plate into pieces, to obtain a plurality of sintered piezoelectric thin wires;

(d) transferring the plurality of the sintered piezoelectric thin wires provisionally fixed on the substrate;

(e) repeating the steps (a) to (d) a plurality of times, so as to prepare a plurality of composite sheet units on a surface of each of which a plurality of the sintered piezoelectric thin wires are arranged in a uniform direction;

(f) laminating a plurality of the composite sheet units so that the sintered piezoelectric thin wires are positioned between the resin layers; and (g) integrating the plurality of the composite sheet units thus laminated.

A fourth piezocomposite production method of the present invention includes the steps of:

(a) arranging a plurality of sintered piezoelectric thin wires in a uniform direction on a surface of a resin layer, and providing a resin sheet on the sintered piezoelectric thin wires;

(b) integrating the resin layer, the sintered piezoelectric thin wires, and the resin sheet by a process comprising compressing, so that the sintered piezoelectric thin wires are sandwiched between the resin layer and the resin sheet, and that a resin of the resin sheet is deformed so as to fill grooves between the sintered piezoelectric thin wires, thereby forming a composite sheet unit;

(c) repeating the steps (a) and (b) a plurality of times, so as to form a plurality of composite sheet units, each of which is composed of the resin layer, the resin sheet, and the plurality of the sintered piezoelectric thin wires arranged in a uniform direction between the resin layer and the resin sheet;

(d) laminating the plurality of the composite sheet units so that the sintered piezoelectric thin wires are provided in parallel; and (e) integrating the plurality of the composite sheet units thus laminated.

A fifth piezocomposite production method of the present invention includes the steps of:

(a) preparing two pieces of resin layers on each of which a plurality of sintered piezoelectric thin wires are arranged in a uniform direction;

(b) laminating the two resin layers so that the sintered piezoelectric thin wires provided on a surface of one of the resin layers are positioned between the sintered piezoelectric thin wires provided on a surface of the other resin layer, and integrating the same, so as to form a composite sheet unit;

(c) repeating the steps (a) and (b) a plurality of times, so as to form a plurality of composite sheet units, each of which includes the resin layer, the resin sheet, and the plurality of the sintered piezoelectric thin wires arranged in a uniform direction between the resin layer and the resin sheet;

(d) laminating the plurality of the composite sheet units so that the sintered piezoelectric thin wires are provided in parallel; and (e) integrating the plurality of the composite sheet units thus laminated.

DETAILED DESCRIPTION OF THE INVENTION

Figure 1A:
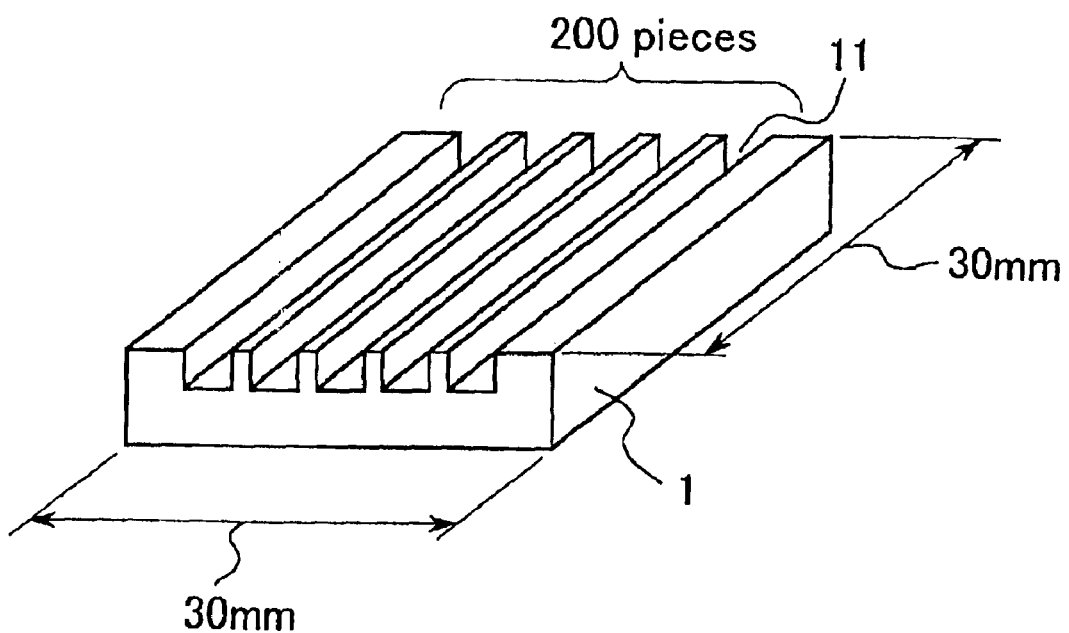
FIG. 1A is a schematic perspective view illustrating a step of preparing a substrate provided with a plurality of grooves according to a first embodiment of the present invention.

In the piezocomposite of the present invention, each of the sintered piezoelectric thin wires preferably is in a prismatic shape having a polygonal cross section with an average edge length of 10 $\mu$m to 500 $\mu$m and having a length of 0.05 mm to 3 mm. Among prismatic shapes, a prismatic shape having a quadrangular cross section, particularly, a trapezoidal cross section, is produced most easily. The size of the piezocomposite and the size of the sintered piezoelectric thin wires in the piezocomposite are determined according to the frequency and the acoustic impedance of the piezocomposite. Though not particularly limited, taking it into consideration that the used frequency generally will be in a range of approximately 1 MHz to 20 MHz since the piezocomposite of the present invention is used in an ultrasonic probe for medical-use ultrasonic diagnostic equipment, each of the sintered piezoelectric thin wire preferably has a cross section with each edge ranging from 10 $\mu$m to 200 $\mu$m in average. Besides, since the best transmission/reception efficiency is obtained when the aspect ratio is set to 5 to 6, each of the sintered piezoelectric thin wires preferably has a length in a range of 0.05 mm (0.01 mm×the aspect ratio of 5) to 3.0 mm (0.5 mm×the aspect ratio of 6).

It should be noted that a piezocomposite may be produced even if sintered piezoelectric thin wires have sizes that are not in the foregoing preferable ranges. The foregoing ranges merely are preferred considering the intended use.

Furthermore, the number of the sintered piezoelectric thin wires arranged on one surface of the resin layer preferably is in a range of 10 to 3000. Some of the production methods of the present invention are characterized in that a sintered piezoelectric plate having a thickness equal to a length of one edge of the sintered piezoelectric thin wire is divided on a resin layer, or alternatively, a sintered piezoelectric plate that has been divided while provisionally fixed is transferred onto a resin, so that a composite sheet unit in which a plurality of sintered piezoelectric thin wires are carried on a resin layer is obtained, and a plurality of the same are laminated. Furthermore, some are characterized in that two of the foregoing composite sheet units are integrated to form a laminated composite sheet unit, and the laminated composite sheet units are laminated and integrated.

On the other hand, considering the preferable size of the foregoing sintered piezoelectric thin wires, a sintered piezoelectric plate having a thickness ranging 10 $\mu$m to 500 $\mu$m, or more preferably, 10 $\mu$m to 200 $\mu$m, is required. Since such a thin sintered piezoelectric plate tends to warp or crack in the producing process, generally it is difficult to produce the same in a large size. A producible size of a sintered piezoelectric plate having the foregoing thickness ranging 10 $\mu$m to 500 $\mu$m, or more preferably, 10 $\mu$m to 200 $\mu$m, has an edge of, or a diameter of, at most approximately 30 mm. In the case where a 30 mm square sintered piezoelectric plate is used and divided into sintered piezoelectric thin wires with an edge in a range of 10 $\mu$m to 500 $\mu$m, or more preferably, 10 $\mu$m to 200 $\mu$m, the number of the sintered piezoelectric thin wires arranged on one surface of the resin layer, that is, the number of the sintered piezoelectric thin wires in one composite sheet unit, is approximately 10 to 1500.

Furthermore, considering also a case where laminated composite sheet units, each of which is obtained by laminating two composite sheet units, are used, the number of the sintered piezoelectric thin wires that can be arranged on one surface of a resin layer is approximately 10 to 3000.

It should be noted that the number may exceed the foregoing provisionally set range, considering the size of an available sintered piezoelectric plate and a required size of a sintered piezoelectric thin wire.

Furthermore, the number of the laminated resin layers preferably is in a range of 20 to 1500. The number of laminated resin layers basically is determined according to the intended size of a piezocomposite, but if the resin layers are laminated to a height greater than a length of an edge of the resin layer (width), they tend to be displaced when laminated and integrated, which makes it difficult to dispose the sintered piezoelectric thin wires at desired positions. A maximum size of the resin layer to be laminated (a resin layer carrying a plurality of sintered piezoelectric thin wires, that is, a composite sheet unit) is approximately 30 mm square, considering the size of the available sintered piezoelectric plate, as described above. On the other hand, the height of the lamination in which a plurality of the composite sheet units are integrated is determined by a maximum thickness of the used composite sheet unit and the number of the sheets laminated. The maximum thickness of the composite sheet unit is determined according to a sum of a length of an edge of the sintered piezoelectric thin wire in the composite sheet unit and the thickness of the used resin layer. Though depending on the length of the sintered piezoelectric thin wire according to the use of purpose, and the thickness of the resin layer, the thickness of the composite sheet unit is considered to be approximately 20 μm to 1000 μμm. Therefore, from the viewpoint of the accuracy and the facilitation upon the lamination and integration, the number of the layers to be laminated preferably is in a range of 20 to 1500. The number, however, is not limited to the foregoing, as long as the desired size of the piezocomposite is obtained with accuracy.

Furthermore, the number of the sintered piezoelectric thin wires arranged in a uniform direction in one piezocomposite preferably is in a range of 200 to 4500000. Considering the number of the sintered piezoelectric thin wires in a preferable composite sheet unit and the number of the composite sheet units to be laminated, it is preferable that the number of the sintered piezoelectric thin wires in a piezocomposite to be obtained finally is in a range of 200 to 4500000.

The size and number of the sintered piezoelectric thin wires and the number of resin layers to be laminated in one piezocomposite of the present invention are determined according to the purpose of the piezocomposite and the available materials.

Furthermore, a cut surface preferably is ground. The thickness of the piezocomposite to be obtained finally, that is, a length between cut surfaces thereof that is perpendicular to the lengthwise direction of the sintered piezoelectric thin wires, should be adjusted according to the frequency used. By grinding the cut surfaces of the piezocomposite, the thickness of the piezocomposite can be controlled finely.

Furthermore, it is necessary to form electrodes on the cut surfaces of the piezocomposite in a certain manner. Though not particularly limited, electrodes may be formed by applying and drying a conductive coating material or by plating. In the case where such a method is used, the cut surfaces (electrode-provided surfaces) are roughened by grinding, which provides an effect of improving the adhesion strength of the electrodes.

Furthermore, the sintered piezoelectric thin wires have cut surfaces in the lengthwise direction. This allows the size of the piezocomposite to be controlled desirably according to the purpose.

Furthermore, the piezocomposite may have a configuration obtained by preparing two composite sheet units, laminating the two composite sheet units so that the sintered piezoelectric thin wires provided on a surface of one of the composite sheet units are positioned between the sintered piezoelectric thin wires provided on a surface of the other composite sheet unit, and integrating the two composite sheet units to form a laminated composite sheet unit, then laminating and integrating the laminated composite sheet unites, and cutting the same in a direction crossing the lengthwise direction of the sintered piezoelectric thin wires. This configuration allows the sintered piezoelectric thin wires to be at a smaller pitch, that is, at smaller intervals.

Furthermore, resin-impregnated-cured portions preferably are provided between the sintered piezoelectric thin wires. By providing the resin-impregnated-cured portions, the mechanical strength of the piezocomposite can be increased.

Furthermore, by impregnating and curing a resin in void portions, it is possible to obtain piezocomposites having a variety of physical properties, particularly acoustic impedances. By selecting a resin to be used for forming the resin-impregnated-cured portions from resins having various physical properties according to the intended purpose, as to the density, the sonic velocity, the Poisson's ratio, the Young's modulus, etc., it is possible to control the physical properties of the obtained piezocomposite.

Furthermore, the resin layer preferably is composed of a plurality of resin layers. By composing the resin layer of a plurality of resin layers, an effect of facilitating the control the distance between the laminated sintered piezoelectric thin wires can be achieved. By bonding the same with a second resin layer having a different thickness, it is possible to facilitate the control of the distance between the laminated sintered piezoelectric thin wires. Furthermore, piezocomposites having different distances between the sintered piezoelectric thin wires in the lamination direction can be produced using the same composite sheet units, by using second resin sheets having different thicknesses. This allows the manufacturing cost to be decreased.

Furthermore, in one piezocomposite, the distance between the sintered piezoelectric thin wires can be varied as to each layer. Though not particularly limited, when one lamination is cut in a direction perpendicular to the lamination direction to produce a plurality of piezocomposites, the production is facilitated by thickening only the resin layers of a portion to be cut.

Furthermore, by using a plurality of resin layers having different physical properties as to the density, the sonic velocity, the Poisson's ratio, the Young's modulus, it is possible to produce piezocomposites having various physical properties. Though not particularly limited, an epoxy resin that is relatively hard may be used for the composite sheet unit so as to fix the sintered piezoelectric thin wires surely, while resin layers made of a silicone resin or a polyurethane resin that are relatively soft may be used for bonding and laminating the composite sheet units. By doing so, a piezocomposite that is mechanically flexible in the lamination direction can be obtained. This is effective particularly in the case where an ultrasonic probe whose tip has a curved surface is produced. Furthermore, this configuration improves the mechanical isolation between the sintered piezoelectric thin wires in the lamination direction. With this effect, in the case where a plurality of oscillators are formed in one piezocomposite by forming a plurality of electrodes, the oscillators can be actuated arbitrarily and individually.

Furthermore, the production method of the present invention preferably further includes the step of impregnating a resin in void portions after the lamination and integration of a plurality of the composite sheet units and curing the same. By impregnating and curing a resin in void portions before cutting, the mechanical strength of the lamination before cutting is increased, thereby reducing damages to the sintered piezoelectric thin wires inside. Consequently, the manufacturing yield is increased, and the manufacturing cost can be reduced.

Furthermore, upon the lamination of a plurality of composite sheet units, adhesive resin sheets preferably are provided between the composite sheet units. Though not particularly limited, the composite sheet units may be those in which a resin layer firmly fixes the sintered piezoelectric plate and is cured sufficiently, and the adhesive resin sheets may be used for bonding a plurality of the composite sheet units. By sufficiently curing the resin layer in the composite sheet unit, the damage to the sintered piezoelectric thin wires is prevented from occurring when the sintered piezoelectric plate is cut into a plurality of the sintered piezoelectric thin wires, and the manufacturing yield of the composite sheet units is improved. Furthermore, even if the resin layer that is cured sufficiently and thereby loses the adhesivity is used in the composite sheet unit, such composite sheet units can be laminated, bonded, and integrated without failure by using second adhesive resin sheets.

Upon lamination of the composite sheet units, an adhesive layer preferably is formed by coating on at least a part of the resin layer in each composite sheet unit. An adhesive layer may be formed by applying an adhesive material with fluidity on a surface of the composite sheet unit where the sintered piezoelectric thin wires are provided. This configuration allows an adhesive material to be filled in cut grooves in the composite sheet unit, whereby a piezocomposite having no void can be obtained without impregnating another resin in void portions at a later step. In other words, without the step of impregnating a resin in void portions and curing the same, a piezocomposite equivalent to the piezocomposite having the resin-impregnated-cured portions can be obtained. Thus, the production process can be simplified. Further, the production method in which the adhesive layer is formed by coating is easier and allows reduction of the material cost, as compared with the case where the adhesive resin sheets are used.

As described above, according to the present invention, a piezocomposite can be obtained by laminating and integrating a desired number of composite sheet unit units, in each of which a desired number of sintered piezoelectric thin wires in a desired size are arranged at desired positions, on a resin layer. Furthermore, according to the production method of the present invention, a desired number of the sintered piezoelectric thin wires in a desired shape are carried fixedly at desired positions by the resin layer, and the positions are constrained. Therefore, the positions thereof do not change in the later process of lamination and integration. By controlling the thickness of the resin layer, it is possible to control the distances between the sintered piezoelectric thin wires in the vertical directions.

Furthermore, as compared with the conventional production method utilizing the etching technique, it is possible to carry out the production within a shorter period of time, and expensive equipment is not needed.

Furthermore, among the production methods of the present invention, the method in which fine sintered pieces are formed on a substrate utilizes a substrate that is used repeatedly, thereby causing no waste of materials, unlike the conventional technique in which a mold is vanished.

As to the method of mechanically processing a sintered piezoelectric plate among the production methods of the present invention, the cut grooves formed in the present invention have a depth only equal to a thickness of the sintered piezoelectric plate, that is, a diameter of the sintered piezoelectric thin wires in the piezocomposite to be obtained, whereas in the conventional method of directly processing a piezoelectric material, the processing is carried out through a distance equal to the length of the sintered piezoelectric thin wires. Therefore, the processing is extremely easy as compared with the conventional processing.

Furthermore, by applying the method of forming a laminated composite sheet unit by integrating composite sheet units, a piezocomposite having a further finer structure can be obtained.

Furthermore, by applying the method of laminating and integrating the composite sheet units or the laminated composite sheet units, it is possible to select good-quality composite sheet units for lamination and integration, thereby improving the manufacturing yield of the piezocomposite.

Furthermore, by dividing the obtained piezocomposite along planes crossing the lengthwise direction of the sintered piezoelectric thin wires, it is possible to improve the productivity and to produce piezocomposites at lower cost.

Furthermore, by providing the resin-impregnated-cured portions, it is possible to control the physical properties of the piezocomposite freely.

As described above, according to the present invention, it is possible to provide a piezocomposite having a desired fine structure, desired physical properties, and high reliability at low cost.

Furthermore, it is possible to provide a high-performance and low-cost ultrasonic probe for use in ultrasonic diagnostic equipment, and high-performance and low-cost ultrasonic diagnostic equipment, in each of which the foregoing piezocomposite is used.

The following description will depict embodiments of the present invention in detail.

First through third embodiments described below relate to a piezocomposite produced by the first production method of the present invention.

First Embodiment

The following description will depict in detail a first embodiment of the present invention as to each of the steps thereof, while referring to FIGS. 1 to 7.

(1) Step of Preparing a Substrate Provided with a Plurality of Grooves

Figure 1B:
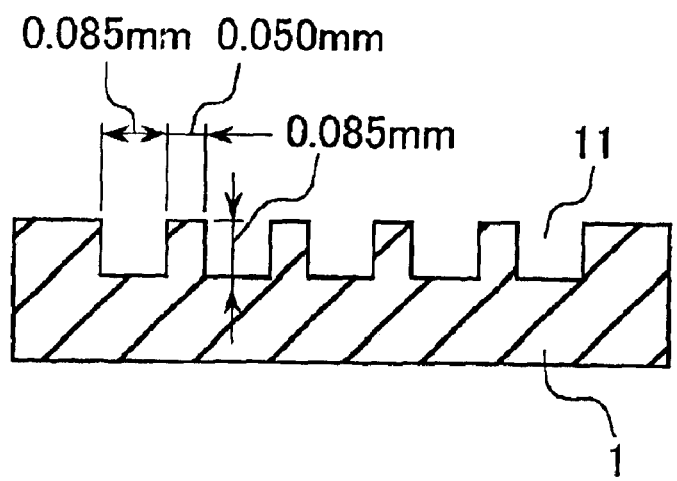
FIG. 1B is a schematic cross-sectional view illustrating the same.

As a step of preparing a substrate provided with a plurality of grooves, a substrate 1 provided with a plurality of grooves 11 by machining was prepared, as shown in the schematic perspective view of FIG. 1A and the schematic cross-sectional view of FIG. 1B. Though not particularly limited, the material forming the substrate 1 preferably has a heat resistance up to approximately 1300° C. and does not have a significantly high reactivity with a piezoelectric material to be sintered, since the piezoelectric material is to be sintered on the substrate in a later step. This is because, in the case where the material has significantly high reactivity with the piezoelectric material, the material is diffused in the substrate upon the sintering, thereby making it impossible to obtain a thin-line-form sinter piece. Preferable examples of the material include ceramic materials such as magnesium oxide, zirconia, and alumina, and silicones. In the present embodiment, a 30 mm square, 7 mm thick magnesium oxide plate with a purity of not less than 99% (Product No.: MG-13, manufactured by Nikkato Corporation) was used.

Further, FIGS. 1A and 1B schematically illustrate the step, and the number of grooves, the shape of the cross section, and the length of the same arbitrarily can be adjusted according to a shape of a piezocomposite to be obtained. For instance, 200 grooves, having shapes as shown in FIG. 1B, a width of 0.085 mm and a depth of 0.085 mm, were formed in parallel at intervals of 0.050 mm by dicing on a surface on one side of the magnesium oxide plate. In forming the grooves 11, any conventional method such as dicing or laser processing may be used, and an appropriate method can be selected according to the required shape of the groove 11. A plurality of groove-provided magnesium oxide substrates were prepared as the foregoing substrate 1.

(2) Step of Applying a Paste Containing a Piezoelectric Powder and a Binder to the Grooves As a step of applying a paste containing a piezoelectric powder and a binder to the grooves 11, a paste composed of a piezoelectric powder, a binder, and a solvent was applied over the grooves 11 on the substrate 1 so as to fill the grooves 11, then, unnecessary paste portions 2 outside the grooves 11 were removed. As a result, the substrate 1 in which the paste 2 was applied to only the inside of each groove 11 was obtained, as shown in the schematic perspective view of FIG. 2A and the schematic cross-sectional view of FIG. 2B. Though not particularly limited, a conventional technique of a thick film material can be applied for forming the paste 2. For instance, a paste obtained by adding 10 cc of an α-terpineol (reagent manufactured by Wako Pure Chemical Industries, Ltd.) solution containing 6 wt % of ethyl cellulose 45 cP (manufactured by Kanto Kagaku) as a binder to 40 g of a piezoelectric powder of lead titanate zirconate (PZT) or the like and kneading the same using a three roll mill can be used. Subsequently, on the groove-provided surface of the groove-provided magnesium oxide plate as the substrate 1, the PZT paste as the paste 2 was applied and squeezed by a rubber squeegee so as to fill the grooves with the PZT paste while removing unnecessary portions of the PZT paste from outside the grooves. Alternatively, to fill the grooves 11 with the paste sufficiently, air bubbles contained therein preferably were removed by depressurizing or vibrating with ultrasonic waves after applying the paste in the grooves 11.

(3) Step of Drying the Coating Films

As a step of drying the coating films, the solvent component was dried and removed from the paste 2 provided in the grooves 11 of the substrate 1. As a method for drying the solvent, any method may be applied, such as natural drying, hot air drying, etc. Besides, according to a quantity to be treated, the batch manner or the continuous manner may be selected. In the present embodiment, the solvent component in the PZT paste was removed by drying the same at 100° C. in a hot air circulating batch-type dryer for 5 minutes.

The step (2) of providing the PZT paste in the grooves and the step (3) of drying the coating films were repeated five times, so that coating films 21 made of the piezoelectric powder and the binder were formed in not less than 90 vol % of the groove portions.

Figure 2A:
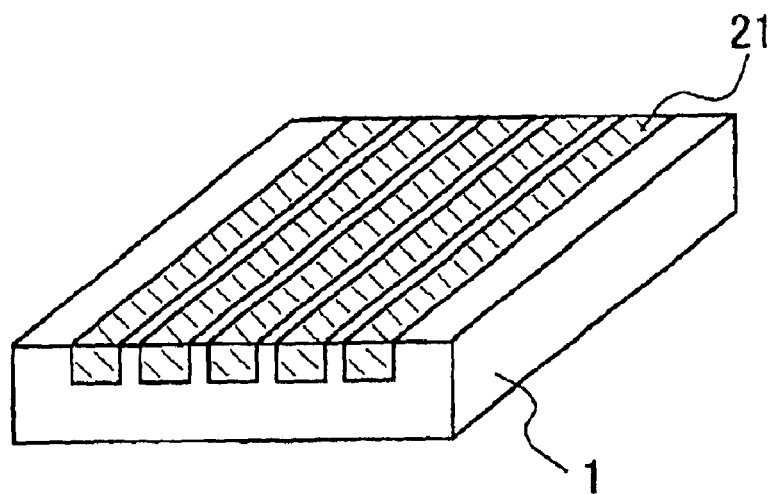
FIG. 2A is a schematic perspective view illustrating a step of applying a paste containing a piezoelectric powder and a binder to the plurality of grooves according to the first embodiment of the present invention.
Figure 2B:
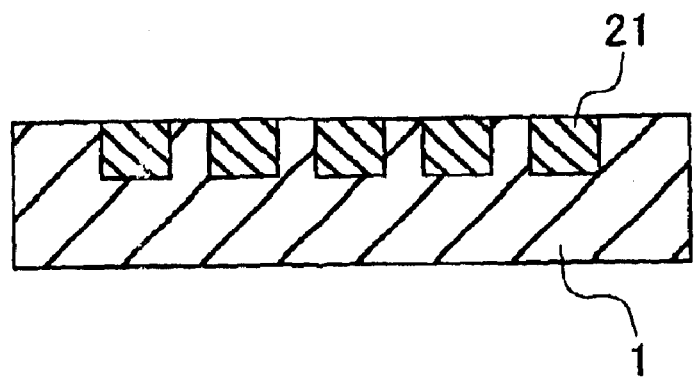
FIG. 2B is a schematic cross-sectional view illustrating the same.
Figure 3A:
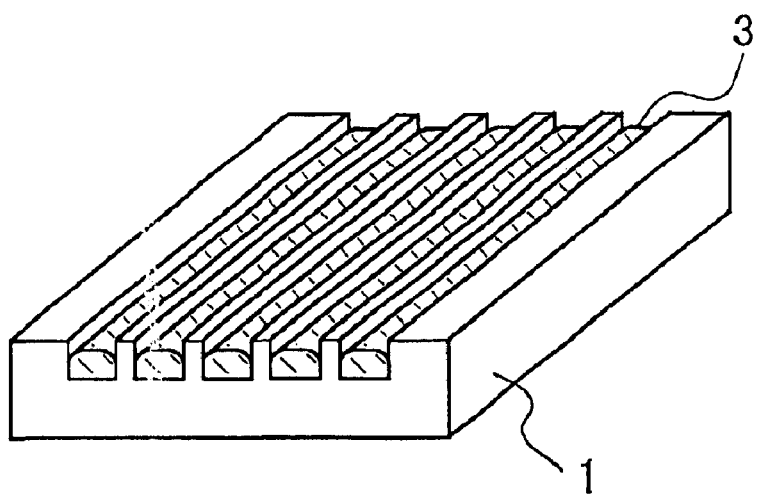
FIG. 3A is a schematic perspective view illustrating a step of applying a heat treatment so that the piezoelectric powder is sintered, so as to obtain sintered piezoelectric thin wires according to the first embodiment of the present invention.
Figure 3B:
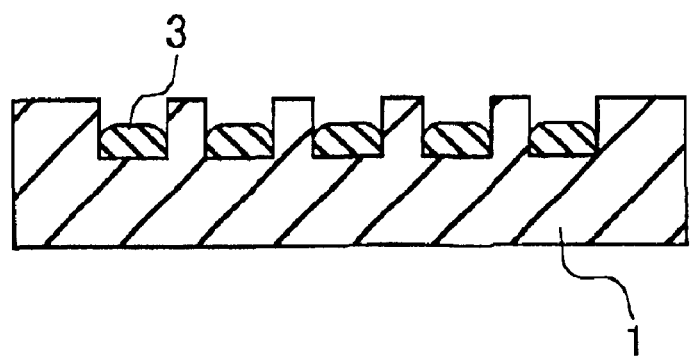
FIG. 3B is a schematic cross-sectional view illustrating the same.

Through the foregoing operation, the groove-provided magnesium oxide plate as the substrate 1 carrying the coating films 21 made of the piezoelectric powder and the binder in the grooves was obtained, as shown in the schematic view of FIGS. 2A and 2B.

(4) Step of Heating the Substrate Carrying the Coating Films After Drying so as to Remove the Binder from the Coating Films As a step of heating the substrate carrying the coating films after drying so as to remove the binder from the coating films, the coating films 21 that had been dried so that the solvent had been removed were further heated so that the binder was removed from the coating films 21. It should be noted that the step of removing the binder is a step of removing an organic binder contained in the coating films 21 by burning or thermal decomposition, and as long as this object is achieved, it may be carried out under any conditions as to the temperature, the duration, and the gas atmosphere, etc., for the step. The groove-provided magnesium oxide plate as the substrate 1 having the coating films 21 in its grooves was subjected to a heat treatment at 400° C. in an ambient atmosphere for two hours, so that the binder was burned and removed from the coating films 21.

(5) Step of Heating the Piezoelectric Powder to Sinter the Same, so as to Obtain Thin-Line-Form Sinter Pieces Subsequently, the heat treatment was continued so that the temperature was raised to 1250° C. during 12.5 hours and thereafter it was maintained at 1250° C. for two hours, so that the piezoelectric powder was sintered. By so doing, thin-line-form sinter pieces 3 were obtained on the substrate 1. The paste 2 that had been dried and from which the binder had been removed was sintered in the grooves 11 of the substrate 1, thereby forming the thin-line-form sinter pieces 3. The thin-line-form sinter pieces 3 thus obtained were sintered in the state of being constrained and arranged in the grooves 11 formed in the substrate 1. Consequently, as shown in the schematic perspective view of FIG. 3A and the schematic cross-sectional view of FIG. 3B, a plurality of thin-line-form sinter pieces 3 were obtained on the substrate 1, arranged at intervals according to the intervals between the grooves 11 formed in the substrate 1. In the present embodiment, 200 thin-line-form sinter pieces, each having a width and a height of 0.065 mm each and a length of 30 mm, were obtained on the substrate 1. Furthermore, the thin-line-form sinter pieces 3 had a volume reduced to 65% in average as compared with the volume in the material paste state. It should be noted that the steps (1) to (5) may be carried out at the same time.

Figure 4A:
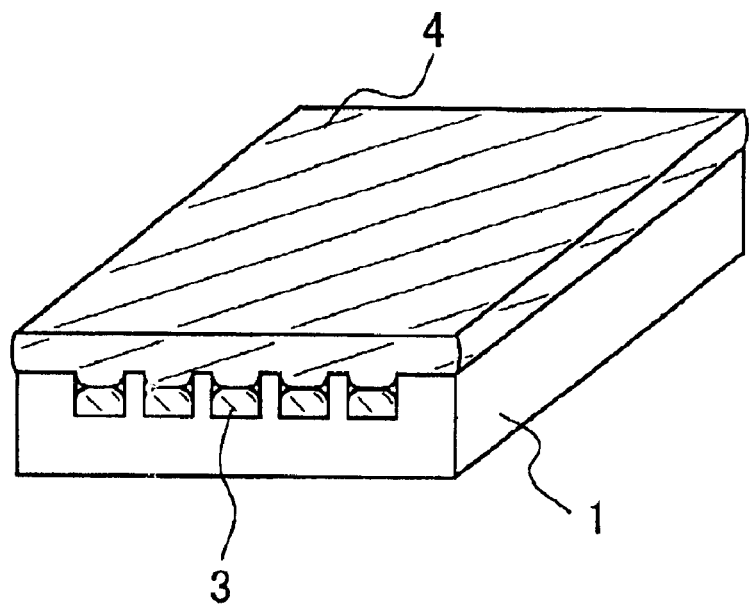
FIG. 4A is a schematic perspective view illustrating a step of bonding a resin layer on the sintered piezoelectric thin wires carried on the substrate according to the first embodiment of the present invention.
Figure 4B:
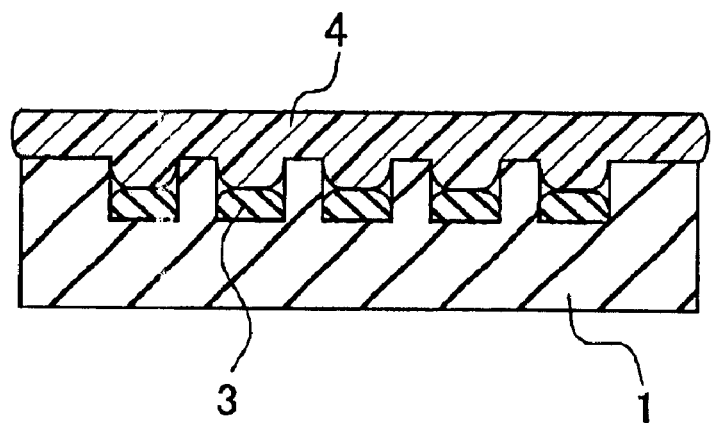
FIG. 4B is a schematic cross-sectional view illustrating the same.

(6) Step of Bonding a Resin Layer onto the Thin-Line-Form Sinter Pieces Carried on the Substrate Furthermore, as shown in the schematic perspective view of FIG. 4A and the schematic cross-sectional view of FIG. 4B, a resin layer 4 was bonded onto the plurality of the thin-line-form sinter pieces 3 carried on the substrate 1 at intervals identical to the intervals between the grooves 11 formed in the substrate 1. More specifically, an epoxy resin sheet with a size of 30 mm square and a thickness of 0.12 mm in a half-cured state (B stage) as a resin layer 4 was provided over the 200 thin-line-form sinter pieces 3 carried on the substrate 1 at intervals corresponding to the intervals between the grooves 11 formed in the substrate 1, and was compressed with a pressure of 10 kg/cm$^2$ for 10 minutes while heated at 120° C., whereby the epoxy resin sheet as the resin layer was bonded to the thin-line-form sinter pieces.

(7) Step of Separating the Resin Layer from the Substrate so as to Obtain a Composite Sheet Unit Carrying the Thin-Line-Form Sinter Pieces By separating the resin layer 4 from the substrate 1, the thin-line-form sinter pieces 3 were transferred onto the surface of the resin layer 4. Consequently, a composite sheet unit 5 having the plurality of thin-line-form sinter pieces 3 provided on the resin layer 4 at intervals corresponding to the intervals between the grooves formed in the substrate 1 was obtained. The composite sheet unit 5 thus obtained had a size of 30 mm in horizontal length (in a direction in which the thin-line-form sinter pieces 3 are arranged)×30 mm in vertical length. In a range of approximately 27 mm in the horizontal length of 30 mm, 200 thin-line-form sinter pieces 3 were transferred and arranged at intervals of approximately 0.07 mm. Each thin-line-form sinter piece 3 had a thickness of 0.065 mm in average, a width of its portion exposed to the air of 0.065 mm in average, and a length of 30 mm.

Figure 5A:
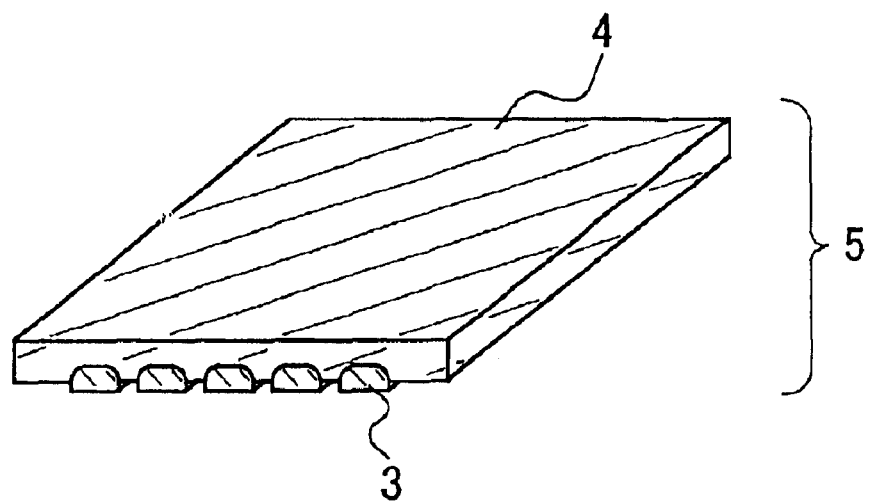
FIG. 5A is a schematic perspective view illustrating a step of obtaining a composite sheet unit carrying the sintered piezoelectric thin wires according to the first embodiment of the present invention.
Figure 5B:
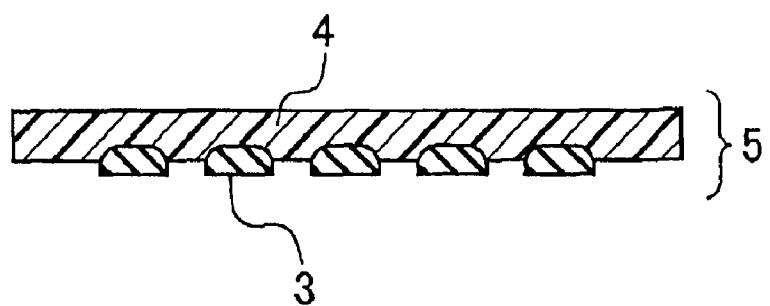
FIG. 5B is a schematic cross-sectional view illustrating the same.

Through the foregoing step, the composite sheet unit 5 having the plurality of thin-line-form sinter pieces 3 provided on the resin layer 4 at intervals identical to the intervals between the grooves 11 formed in the substrate 1 was obtained, as shown in the schematic perspective view of FIG. 5A and the schematic cross-sectional view of FIG. 5B.

(8) Step of Laminating a Plurality of the Composite Sheet Units

Figure 6A:
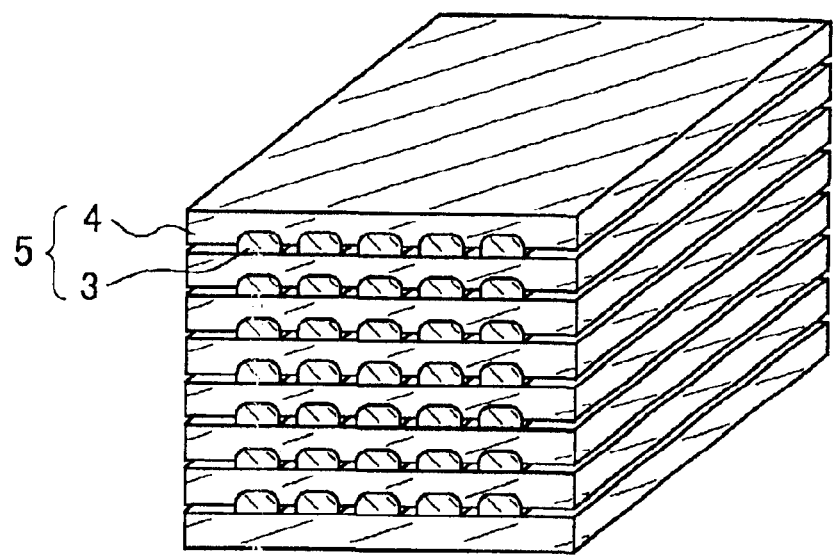
FIG. 6A is a schematic perspective view illustrating a step of laminating the composite sheet units according to the first embodiment of the present invention.
Figure 6B:
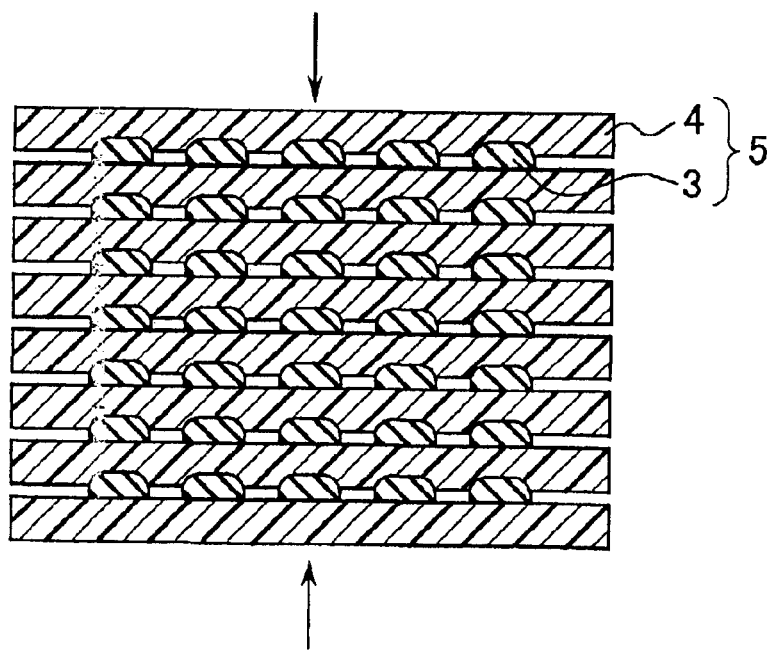
FIG. 6B is a schematic cross-sectional view illustrating the same.

As shown in the schematic perspective view of FIG. 6A and the schematic cross-sectional view of FIG. 6B, 200 of the foregoing composite sheet units 5 in total were laminated.

(9) Step of Integrating the Plurality of Composite Sheet Units Thus Laminated

Figure 7A:
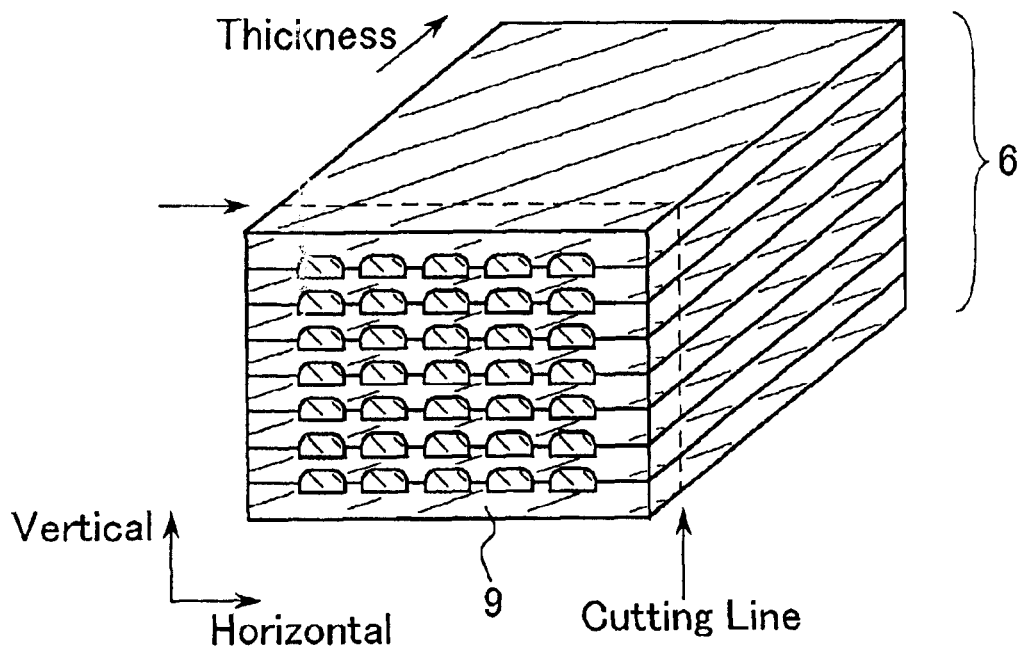
FIG. 7A is a schematic perspective view illustrating a step of integrating the plurality of the composite sheet units thus laminated according to the first embodiment of the present invention.
Figure 7B:
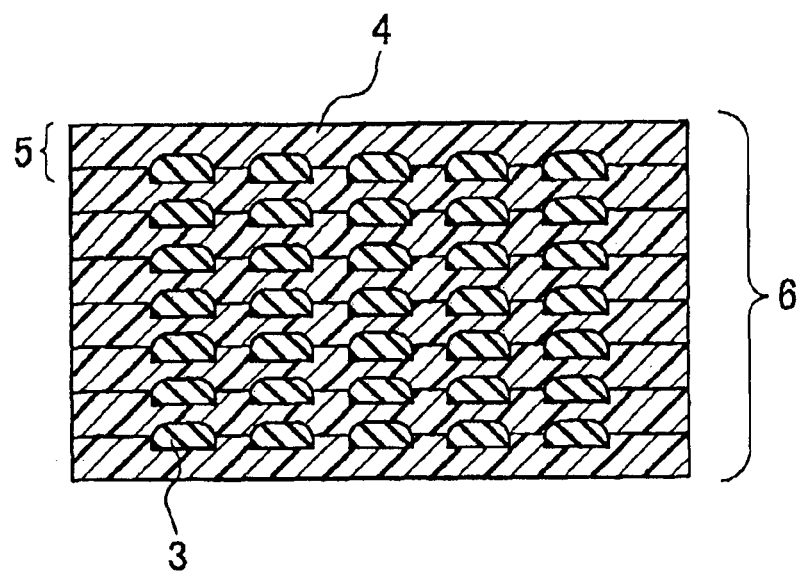
FIG. 7B is a schematic cross-sectional view illustrating the same.

The 200 composite sheet units 5 laminated were integrated, so as to obtain a piezocomposite 6 as shown in the schematic perspective view of FIG. 7A and the schematic cross-sectional view of FIG. 7B. As a method for integrating the same, any method can be selected, such as pressing, hot pressing, bonding, etc., which are conventional techniques. In the present embodiment, they are integrated by hot pressing. More specifically, the lamination composed of 200 composite sheet units was heated at 120° C. for 10 minutes while subjected to a pressure of 10 kg/cm² in the lamination direction. Thereafter, the temperature was raised to 150° C. during 10 minutes, then, the lamination was maintained at 150° C. for 60 minutes.

The piezocomposite 6 thus obtained has a size of 32 mm in horizontal length (in the direction in which the thin-line-form sinter pieces 3 were arranged), 27 mm in vertical length (in the lamination direction), and 30 mm in thickness (in a lengthwise direction of the thin-line-form sinter pieces). In other words, in a portion of the plate at the center of the piezocomposite 6 (27 mm in horizontal length×27 mm in vertical length×30 mm in thickness), 40000 thin-line-form sinter pieces 3, each having a cross section of approximately 0.065 mm square, were arranged uniformly with the epoxy resin interposed therebetween. It is possible to adjust the thickness of the piezocomposite 6 desirably. Besides, it is possible to slice the piezocomposite 6 in the thickness direction, so as to divide the same into a plurality of pieces of a piezocomposite with desired thicknesses.

The production method of the present invention makes it possible to obtain the piezocomposite 6 by providing a desired number of composite sheet units 5, each in a desired shape, at desired positions and integrating the same.

The diameter and length of the thin-line-form sinter pieces 3 to be sintered are determined according to the shape of the grooves 11 formed in the substrate 1 as well. By providing on the substrate 1 a desired number of the grooves 11, each with a desired depth and a desired length according to the required number, diameter, and length of the thin-line-form sinter pieces, it is possible to obtain a desired number of thin-line-form sinter pieces 3, each in a desired shape.

Furthermore, by the production method of the present invention, the intervals between the grooves 11 are set according to the required intervals between the thin-line-form sinter pieces 3 in the object piezocomposite 6, as shown in FIGS. 7A and 7B. By forming the grooves 11 in this manner, it is possible to form thin-line-form sinter pieces 3 in desired shapes at a desired pitch on the substrate 1. In forming the substrate 1 and the grooves 11 in desired shapes on the substrate 1, a substrate material can be selected from a wider range as compared with the conventional methods in which piezoelectric materials are directly processed, and conventional machining techniques can be applied, while micro-machining is carried out readily. Furthermore, in the conventional method in which a piezoelectric material is processed directly, it is necessary to carry out the processing for the lengthwise distance of the thin-line-form sinter pieces. In contrast, the grooves 11 formed in the present invention may have a relatively small depth according to the diameter of the thin-line-form sinter pieces, and the processing is carried out readily.

Furthermore, according to the production method of the present invention, a plurality of the thin-line-form sinter pieces 3 are bonded and transferred onto the surface of the resin layer 4, so that the composite sheet unit 5 is obtained. The present invention therefore allows a desired number of thin-line-form sinter pieces 3 in a desired shape at desired positions to be formed on the resin layer 4 readily. Since the positions of the thin-line-form sinter pieces 3 on the composite sheet unit 5 are fixed by the resin layer 4, the arranged positions do not change upon the subsequent integration of the lamination. Furthermore, the intervals in the vertical direction of the thin-line-form sinter pieces 3 in the piezocomposite 6 in FIGS. 7A and 7B are determined according to the thickness of the resin layer 4 in the composite sheet unit 5. In other words, by controlling the thickness of the resin layer 4, it is possible to desirably control the intervals between the thin-line-form sinter pieces 3 in the vertical direction.

Furthermore, a piezocomposite is obtained by laminating and integrating a required number of composite sheet units 5 each carrying the thin-line-form sinter pieces 3.

With the present invention thus arranged, extremely fine thin-line-form sinter pieces that conventionally have been difficult to form can be produced readily, and the thin-line-form sinter pieces that have been difficult to handle because of the fineness can be arranged readily at any desired positions in the piezocomposite 6 as a final product.

Furthermore, conventional techniques such as machining and thick-film sintering can be used in production, thereby making the production method easy. Besides, as compared with the production method utilizing etching techniques, the production can be completed within a shorter period of time, and does not require any expensive equipment.

Furthermore, since a repeatedly usable substrate is used in forming fine sinters, wasteful usage of materials as in the conventional techniques is eliminated.

By applying the production method of the present invention, with the aforementioned configurations and effects, it is possible to provide a piezocomposite having a fine configuration at low cost.

Second Embodiment

Figure 8:
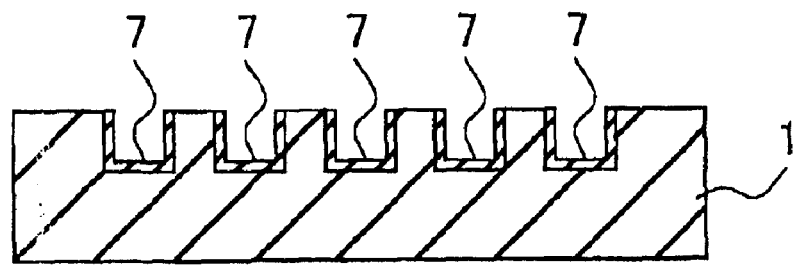
FIG. 8 is a schematic cross-sectional view illustrating a substrate used according to a second embodiment of the present invention.

A production method according to a second embodiment of the present invention is the above-described production method according to the first embodiment further modified so that a step of forming protective layers 7 on at least parts of surfaces of the grooves 11 formed on the surface of the substrate 1 as shown in the schematic cross-sectional view of FIG. 8, is carried out after the step (a) of preparing the substrate provided with a plurality of grooves, and thereafter, the same steps as those in the first embodiment are carried out sequentially.

With the production method according to the second embodiment of the present invention, the following effect can be achieved in addition to the configuration and effects described concerning the first embodiment, because of the provision of the protective layers 7. Namely, the piezoelectric material is prevented from significantly diffusing in the substrate 1 when the thin-line-form sinter pieces are obtained through a heat treatment, thereby resulting in that the manufacturing yield is improved. Consequently, it is possible to further reduce the production cost of the piezocomposite as a whole.

Appropriate as the protective layer 7 is a protective layer that is stable against heat applied in the sintering step that is to be carried out later, and that is hardly diffused in the later-obtained thin-line-form sinter pieces made of the piezoelectric material. Furthermore, by selecting a protective layer that has slight reactivity with the thin-line-form sinter pieces, the fixing of the thin-line-form sinter pieces 3 by the grooves 11 on the substrate 1 is increased, whereby an effect of facilitating the transport that is intended for the later-performed steps is achieved. Though not particularly limited, an inorganic coating film or an inorganic oxide film is appropriate as the protective layer 7. More specifically, preferable examples of the material include ceramic materials such as magnesium oxide, zirconia, and alumina, silicones, and composite materials of these. Further, conventional techniques such as a method utilizing powder sintering, chemical vapor deposition (CVD), vapor deposition utilizing an electronic beam, etc., may be used as the method for forming the protective layers.

It should be noted that the substrate 1 having the grooves 11 on whose surfaces the protective layers 7 are formed by the present production method can be used repeatedly when piezocomposites are produced, thereby making it possible to avoid an increase in the production cost.

Third Embodiment

A production method according to a third embodiment of the present invention is the above-described production method according to the first embodiment further modified as follows. Namely, a step of forming releasing layers 8 on at least parts of the surface of the substrate 1 except for the surfaces of the grooves 11 as shown in the schematic cross-sectional view of FIG. 9, is carried out after the step (a) of preparing the substrate provided with a plurality of grooves, and thereafter, the same steps as those in the first embodiment are carried out sequentially.

By the production method according to the third embodiment of the present invention, the following effect can be achieved in addition to the configuration and effects described concerning the first embodiment, because of the provision of the releasing layers 8 on at least parts of the surface of the substrate 1 other than the grooves 11. Namely, the separation of the thin-line-form sinter pieces 3 is facilitated in the later-performed step of obtaining a composite sheet unit carrying thin-line-form sinter pieces by separating the resin layer from the substrate. This allows the manufacturing yield to be improved. Consequently, it is possible to further reduce the production cost of the piezocomposite as a whole.

Figure 9:
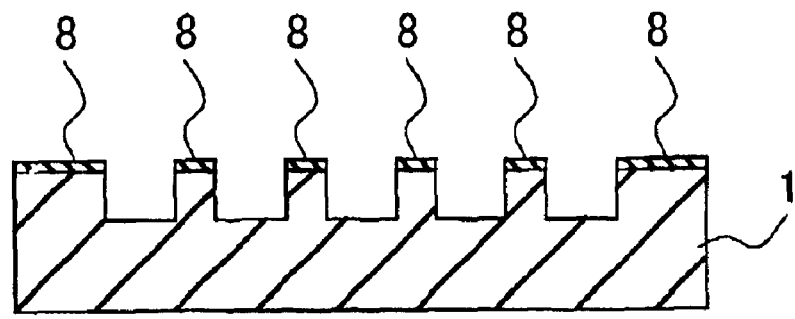
FIG. 9 is a schematic cross-sectional view illustrating a substrate used according to a third embodiment of the present invention.

To form the releasing layer 8, physical states of the surface may be changed as shown in FIG. 9, for instance, so that it serves as the releasing layer. More specifically, the surface may be roughened so that physical contact areas thereof with the resin layer are decreased. By so doing, the separation of the resin layer from the substrate can be improved.

Though not particularly limited, the method for roughing the surface preferably is a method of physically roughening the surface, such as sand-blasting or abrasion, or a chemical technique such as etching.

It should be noted that the substrate 1 provided with the releasing layers 8 on its surface by the present production method can be used repeatedly when piezocomposites are produced, thereby making it possible to avoid an increase in the production cost.

Fourth through sixth embodiments described below relate to a piezocomposite produced by the above-described second production method of the present invention.

Fourth Embodiment

The following description will depict in detail a fourth embodiment of the present invention as to each of the steps thereof, while referring to FIGS. 10 to 13.

Figure 10:
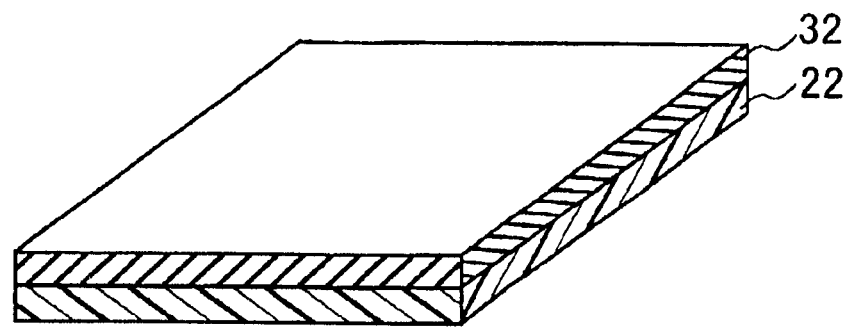
FIG. 10 is a schematic perspective view illustrating a step of forming resin layers on the sintered piezoelectric plate according to a fourth embodiment of the present invention.
Figure 11:
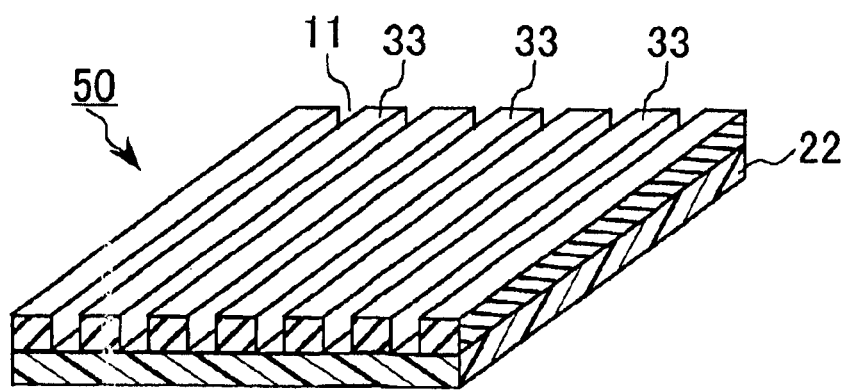
FIG. 11 is a schematic perspective view illustrating a step of cutting the sintered piezoelectric plate into a plurality of sintered piezoelectric thin wires according to the fourth embodiment of the present invention.

First of all, as steps of (a) preparing a sintered piezoelectric plate having a thickness ranging from 10 $\mu$m to 500 $\mu$m and (b) forming a resin layer on the sintered piezoelectric plate, an epoxy resin layer in a size of 17 mm in vertical length×17 mm in horizontal length×0.05 mm in thickness was formed on a sintered piezoelectric plate containing PZT (lead zirconate titanate) as the principal component and having a size of 17 mm in vertical length×17 mm in horizontal length×0.05 mm in thickness as a sintered piezoelectric plate 32, as shown in the schematic perspective view of FIG. 10. More specifically, two epoxy-base-resin adhesive sheets (Product No.: T2000, manufactured by Hitachi Chemical Co., Ltd.), each in a size of 17 mm in vertical length×17 mm in horizontal length×0.025 mm in thickness, were laminated on one side of the aforementioned sintered piezoelectric plate, and were heated at 120° C. for one hour while subjected to a pressure of 10 kg/Cm$^2$ in a vacuum atmosphere (not more than 13.32 Pa (0.1 Torr)). By so doing, the foregoing resin adhesive sheets were bonded on the sintered piezoelectric plate, so as to form a resin layer.

Then, a step (c), applied to the sintered piezoelectric plate provided with the resin layer, formed a plurality of parallel cut grooves without completely dividing the resin layer so as to cut the sintered piezoelectric plate into a plurality of sintered piezoelectric thin wires. 170 cut grooves, each having a width of 0.05 mm and a depth of 0.05 mm to 0.06 mm, were formed at intervals of 0.1 mm on the sintered piezoelectric plate having the foregoing resin layer, using a dicing machine. As a result, as shown in the schematic perspective view of FIG. 11, a composite sheet unit 50 was obtained that was composed of a resin layer 2 having a size of 17 mm in vertical length×17 mm horizontal length×0.05 mm in thickness and 170 sintered piezoelectric thin wires, each having a width of 0.05 mm, a thickness of 0.05 mm, and a length of 17 mm. 11 denotes a cut groove.

It should be noted that as a result of the foregoing machining, 170 sintered piezoelectric thin wires 33 were arranged in parallel at uniform intervals of 0.05 mm, with their lower surfaces being bonded with the resin layer 22.

Then, the steps (a) to (c) were repeated a plurality of times, whereby 170 identical composite sheet units were obtained.

Next, as steps of (e) laminating a plurality of the composite sheet units so that the sintered piezoelectric thin wires were interposed between the resin layers and (f) integrating a plurality of the composite sheet units that were laminated, 170 of the above-described composite sheet units were laminated so that the thin-line-form sintered piezocomposite pieces were arranged in parallel, and on top of the same, two epoxy-base-resin adhesive sheets (Product No.: T2000 manufactured by Hitachi Chemical Co., Ltd.), each having a size of 17 mm in vertical length×17 mm in horizontal length×0.025 mm in thickness, were laminated. The lamination was heated at 170° C. for one hour while subjected to a pressure of 10 kg/cm$^2$ in a vacuum atmosphere (not more than 13.32 Pa (0.1 Torr)), so as to be integrated.

It should be noted that the integrated lamination was a piezocomposite 6 in a cubic shape with each edge of 17 mm in length, in which 28900 (170×170) sintered piezoelectric thin wires, each having a width of 0.05 mm, a thickness of 0.05 mm, and a length of 17 mm, were carried fixedly at uniform intervals in parallel by the resin layers 22.

Next, as a step (g) of cutting the obtained lamination in a direction crossing the lengthwise direction of the sintered piezoelectric thin wires, the lamination obtained through the aforementioned steps was divided into a plurality of pieces along planes crossing the lengthwise direction of the sintered piezoelectric thin wires in the lamination. More specifically, by cutting the same with a wire saw, the thickness of the piezocomposite 6 can be controlled desirably. By slicing the piezocomposite 6 in the thickness direction, the piezocomposite 6 can be divided into a plurality of piezocomposite pieces 9 with desired thicknesses, as shown in the schematic perspective view of FIG. 13.

According to the production method of the present invention, the piezocomposite 6 can be obtained by integrating a desired number of the composite sheet units 50, each of which is obtained by providing a desired number of the sintered piezoelectric thin wires 33, each in a desired size, at desired positions on the resin layer 22.

The diameter, thickness, and width of the sintered piezoelectric thin wires 33 in the composite sheet unit 50 are determined by the thickness of the sintered piezoelectric plate 32 and the depth and width of the cut grooves 11 formed in the sintered piezoelectric plate 32.

Furthermore, the length of the sintered piezoelectric thin wires 33 is determined according to the size of the sintered piezoelectric plate 32.

According to the required shape and number of the sintered piezoelectric thin wires 33 in the piezocomposite 6, the thickness and size of the sintered piezoelectric plate 32 used therein, the depth and width of the cut grooves 11, and the number of the cut grooves may be controlled desirably, so that the composite sheet unit 50 is obtained in which a desired number of the sintered piezoelectric thin wires 33 each in a desired shape are carried at desired positions on the resin layer 22.

Furthermore, in the production method of the present invention, thus, the desired number of the sintered piezoelectric thin wires in the desired shape are carried and fixed at the positions by the resin layer 22. Therefore, the positions thereof are constrained, and the positions thus arranged do not change in the subsequent lamination integrating process.

Figure 12:
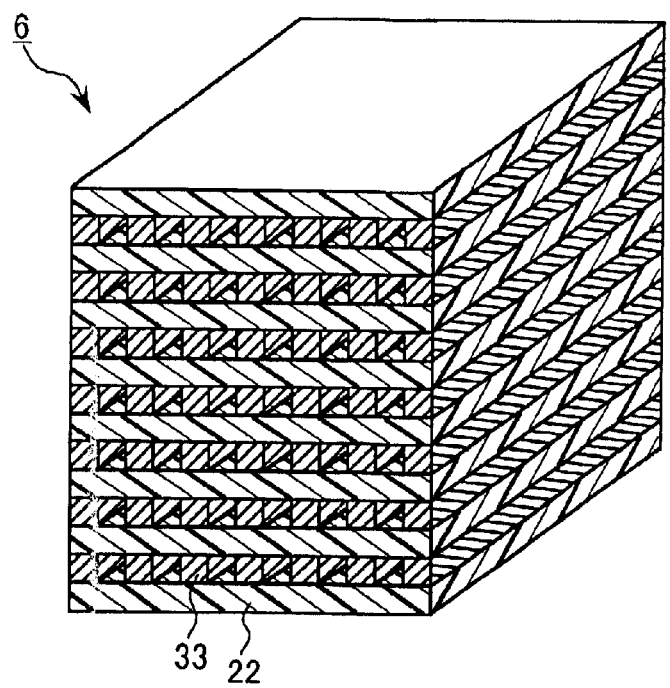
FIG. 12 is a schematic perspective view illustrating a step of laminating and integrating composite sheet units according to the fourth embodiment of the present invention.

Furthermore, the interval in the vertical direction between the sintered piezoelectric thin wires 33 in the piezocomposite 6 shown in FIG. 12 is determined by the thickness of the resin layer 22 in the composite sheet unit 50. In other words, by controlling the thickness of the resin layer 22, it is possible to desirably control the interval in the vertical direction between the sintered piezoelectric thin wires 33.

By using the present invention thus arranged, the extremely fine sintered piezoelectric thin wires that conventionally have been difficult to form can be produced readily, and the sintered piezoelectric thin wires that have been difficult to handle because of the fineness can be arranged readily at any desired positions in the piezocomposite 6 as a final product.

Furthermore, as compared with the conventional method of directly processing a piezoelectric material, in which it is necessary to carry out the processing for the lengthwise distance of the sintered piezoelectric thin wires, the grooves 11 formed in the present invention may have a relatively small depth according to the diameter of the sintered piezoelectric thin wires, that is, the processing is carried out only to a depth corresponding to the required diameter of the sintered piezoelectric thin wires in the piezocomposite. Therefore, the processing is carried out extremely readily, as compared with the conventional processing. Furthermore, the conventional techniques such as machining can be applied for production.

By applying the method of laminating and integrating the composite sheet units 50, only the composite sheet units 50 with good quality can be selected so as to be laminated and integrated, whereby the manufacturing yield of the piezocomposite can be improved.

Figure 13:
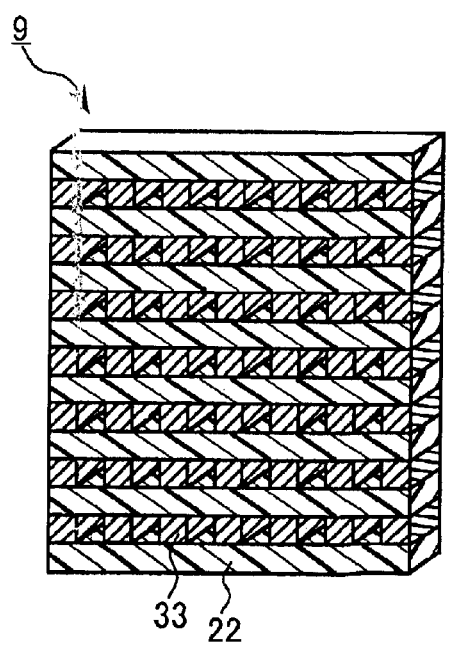
FIG. 13 is a schematic perspective and cross-sectional view illustrating a piezocomposite according to the fourth embodiment of the present invention.

Furthermore, only by dividing the obtained piezocomposite into pieces along planes crossing the lengthwise direction of the sintered piezoelectric thin wires, a plurality of piezocomposite pieces as shown in the schematic perspective view of FIG. 13 can be obtained. Therefore, the productivity can be improved, and the piezocomposite pieces can be produced at lower cost.

Furthermore, by grinding the same, the thickness of the piezocomposite 9 can be controlled desirably.

By applying the production method of the present invention, the configuration, functions, and effects of the same as described above allow a piezocomposite having a desired fine structure to be produced at low cost.

It should be noted that the method applied in the formation of the cut grooves 11 is not limited to the dicing method, but the conventional methods such as the laser processing or the sand-blasting may be applied.

Fifth Embodiment

Figure 14:
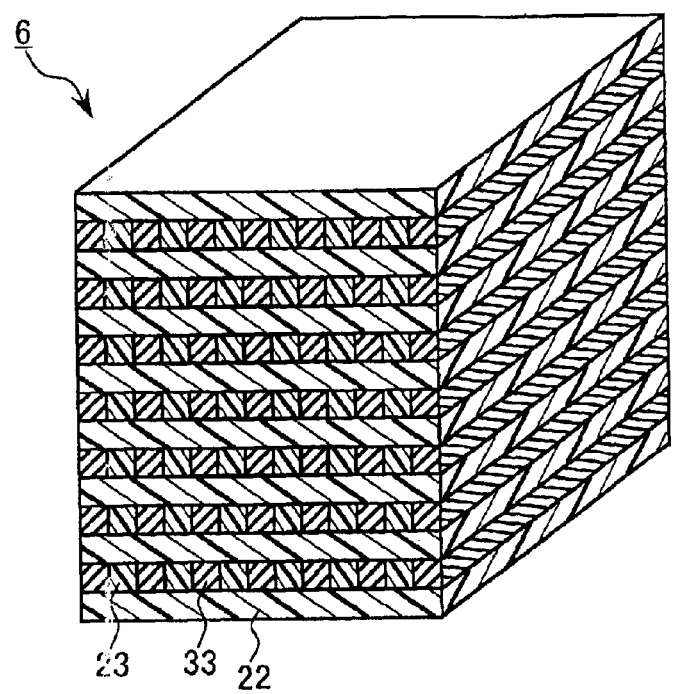
FIG. 14 is a schematic perspective view illustrating a step of impregnating a resin in void portions after lamination and integration and curing the same according to a fifth embodiment of the present invention.
Figure 15:
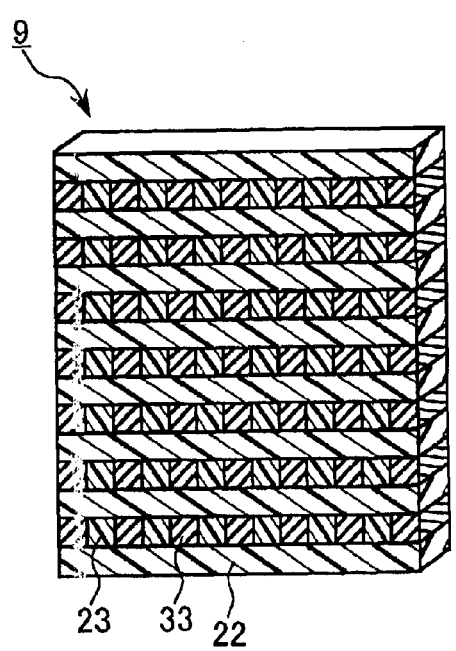
FIG. 15 is a schematic perspective and cross-sectional view illustrating a piezocomposite according to the fifth embodiment of the present invention.

The following description will depict a fifth embodiment of the present invention in detail, while referring to FIGS. 14 and 15.

A piezocomposite according to the fifth embodiment of the present invention further includes resin-impregnated-cured portions in the aforementioned configuration according to the fourth embodiment.

In addition to the production method as shown in the fourth embodiment, after the lamination and integration, a resin is impregnated in void portions and cured. More specifically, the steps (a) to (f) according to the fourth embodiment were carried out sequentially, and an epoxy resin (Araldite Standard: Ciba-Geigy Co., Ltd.) was impregnated into void portions in the obtained composite lamination under vacuum (not more than 13.32 Pa (0. 1 Torr)). Then, it was left to stand at normal temperature for 12 hours so that the resin was cured and formed resin-impregnated-cured portions 23. Thus, the piezocomposite 6 as shown in the schematic perspective view of FIG. 14 was obtained.

Furthermore, as is in the fourth embodiment, by grinding or cutting the same, the thickness of the piezocomposite 6 can be controlled desirably.

Furthermore, by the same method as that shown with regard to the step (g) in the fourth embodiment, the piezocomposite 6 can be sliced in the thickness direction so as to be divided into a plurality of piezocomposite pieces 9 with desired thicknesses (FIG. 15).

According to the fifth embodiment of the present invention, in addition to the effects achieved by the fourth embodiment, the following effects can be achieved by impregnating a resin in void portions in the lamination and curing the same so as to provide resin-impregnated-cured portions. Namely, the falling off of the sintered piezoelectric thin wires 33, which tends to occur upon the grinding or the cutting and dividing, is suppressed, thereby allowing the manufacturing yield to be improved.

Furthermore, the provision of the resin-impregnated-cured portions allows desirable control of physical properties of the piezocomposite. It should be noted that the resin to be impregnated and cured is not limited to an epoxy resin, but it may be a silicone resin or an urethane resin. It may be selected desirably according to the intended physical properties of the piezocomposite, such as the density and acoustic velocity.

Sixth Embodiment

Figure 16A:
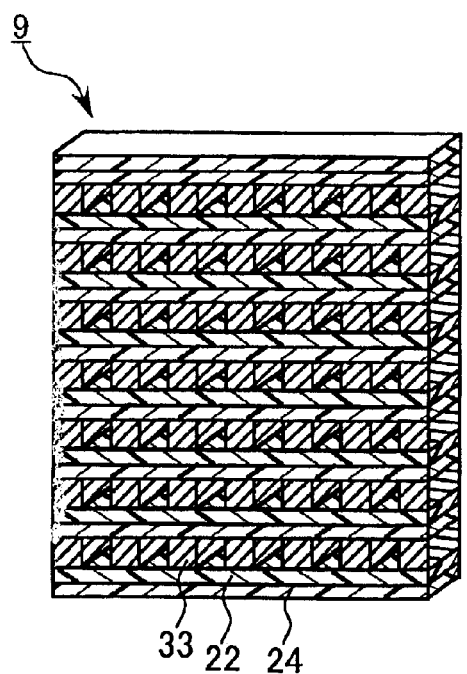
FIGS. 16A and 16B are schematic perspective views illustrating piezocomposites in which a resin layer is composed of a plurality of resin layers, according to a sixth embodiment of the present invention.
Figure 16B:
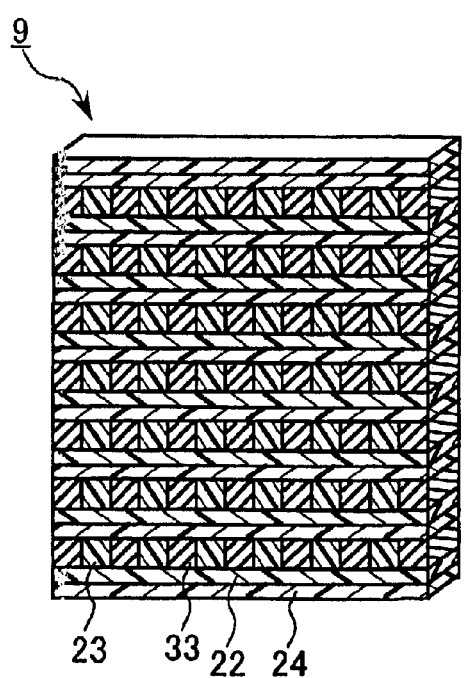

The following description will depict a sixth embodiment of the present invention in detail, while referring to FIGS. 16A and 16B.

A piezocomposite according to the sixth embodiment of the present invention has the same configuration as that according to the fourth embodiment that is further modified so that the foregoing resin layer is composed of a plurality of resin layers.

As steps of (a) preparing a sintered piezoelectric plate having a thickness ranging from 10 μm to 500 μm and (b) forming a resin layer on the sintered piezoelectric plate, a resin layer 2 in a size of 17 mm in vertical length×17 mm in horizontal length×0.05 mm in thickness was formed on a sintered piezoelectric plate containing PZT (lead zirconate titanate) as the principal component and having a size of 17 mm in vertical length×17 mm in horizontal length×0.05 mm in thickness as a sintered piezoelectric plate 1. More specifically, one epoxy-base-resin adhesive sheet in a size of 17 mm in vertical length×17 mm in horizontal length×0.025 mm in thickness (Product No.: T2000 manufactured by Hitachi Chemical Co., Ltd.) was laminated on one side of the aforementioned sintered piezoelectric plate, and was heated at 170° C. for one hour while subjected to a pressure of 10 kg/cm² under vacuum (not more than 13.32 Pa (0.1 Torr)). By so doing, the foregoing resin adhesive sheet was bonded on the sintered piezoelectric plate, so as to form a resin layer. Thus, these steps are the same as those in the fourth embodiment except that the resin layer had a thickness of 0.025 mm and that the temperature of the heat treatment was set to 170° C.

Then, as a step (c), applied to the sintered piezoelectric plate provided with the resin layer, of forming a plurality of parallel cut grooves without completely dividing the resin layer so as to cut the sintered piezoelectric plate into a plurality of sintered piezoelectric thin wires, cut grooves are formed in the same manner as that in the aforementioned embodiments. As a result, a composite sheet unit was obtained that was composed of a resin layer 22 having a size of 17 mm in vertical length×17 mm in horizontal length× 0.05 mm in thickness and 170 sintered piezoelectric thin wires, each having a width of 0.05 mm, a thickness of 0.05 mm, and a length of 17 mm. It should be noted that as a result of the foregoing machining, 170 sintered piezoelectric thin wires 33 were arranged in parallel at uniform intervals of 0.05 mm, carried by the resin layer 22.

(d) Then, as a result of repeating the steps (a) to (c) a plurality of times, 170 identical composite sheet units were obtained.

Next, as steps of (e) laminating a plurality of the composite sheet units with adhesive resin sheets being interposed between the composite sheet units, 170 of the above-described composite sheet units were laminated so that the sintered piezoelectric thin wires were arranged in parallel, with epoxy-base-resin adhesive sheets (Product No.: HAFP4 manufactured by Hitachi Chemical Co., Ltd.), each in a size of 17 mm in vertical length×17 mm in horizontal length× 0.025 mm in thickness, being interposed between the composite sheet units, respectively (therefore, 169 of the epoxy-base-resin adhesive sheets in total were interposed therebetween). Furthermore, one of the same epoxy-base-resin adhesive sheet (Product No.: HAFP4 manufactured by Hitachi Chemical Co., Ltd.) was provided at the bottom of the foregoing lamination, while two pieces of the same were provided on top of the lamination.

As a step (f) of integrating a plurality of the composite sheet units thus laminated, the lamination was heated at 80° C. for one minute, heated to 170° C. during 30 minutes, and maintained at the same temperature for 30 minutes while subjected to a pressure of 10 kg/cm² in a vacuum atmosphere (not more than 13.32 Pa (0.1 Torr)), so that the lamination was integrated.

It should be noted that, as in the fourth embodiment, the integrated lamination was a piezocomposite in a cubic shape with each edge of 17 mm in length, in which 28900 (170×170) sintered piezoelectric thin wires, each having a width of 0.05 mm, a thickness of 0.05 mm, and a length of 17 mm, were carried fixedly at uniform intervals in parallel by the resin layers 22.

(g) Next, as a step of cutting the lamination in a direction crossing the lengthwise direction of the sintered piezoelectric thin wires, as in the fourth embodiment, the lamination obtained through the aforementioned steps was divided into a plurality of pieces along planes crossing the lengthwise direction of the sintered piezoelectric thin wires in the lamination. More specifically, by cutting the same with a wire saw, the thickness of the piezocomposite can be controlled desirably. By slicing the integrated piezocomposite in the thickness direction, the piezocomposite can be divided into a plurality of piezocomposite pieces 9 with desired thicknesses, as shown in the schematic perspective view of FIG. 16A.

According to the sixth embodiment of the present invention in which a plurality of resin layers are provided, the following effects can be achieved in addition to the effects achieved by the fourth embodiment. Namely, the arrangement precision of the sintered piezoelectric thin wires is improved, and the yield in the integration of the lamination is improved. A generally available epoxy resin sheet aimed for achieving adhesion is a product manufactured in a transient state of a curing reaction. After completely curing the resin, the resin loses the adhesivity, or has a much reduced adhesivity. In the sixth embodiment, first of all, a first resin layer is used, and by completely curing the resin layer, the resin is made to be bonded with the sintered piezoelectric plate. Then, other resin adhesive sheets are used as second resin layers for laminating, bonding, and integrating the composite sheet units. The foregoing configuration makes the fixed arrangement of the sintered piezoelectric thin wires 33 more complete in the composite sheet unit by completely curing the first resin layer, and sufficiently carries out the subsequent lamination and integration by utilizing the second resin layers. Consequently, the manufacturing yield is improved, whereby the production cost of the piezocomposite can be reduced. Furthermore, since the resin layer can be composed of a plurality of layers, the present invention provides more freedom in the control of physical properties of the piezocomposite, as compared with the conventional cases.

It should be noted that, though not particularly limited, a resin adhesive sheet that exhibits adhesivity at a low temperature as compared with the first resin layer preferably is selected as the second resin layer.

It should be noted that the second resin layer may be formed by applying an adhesive.

It should be noted that the resin layer is not limited to that composed of two layers, but it may be composed of not less than two layers.

It should be noted that, following the foregoing step (f) in the present sixth embodiment, the resin-impregnated-cured portions may be provided between the sintered piezoelectric thin wires through the operations identical to those in the fifth embodiment described above, whereby a piezocomposite 9 as shown in the schematic perspective view of FIG. 16B can be obtained. This configuration allows the effects achieved in the fifth embodiment to be achieved, in addition to the effects described above.

Seventh Embodiment

The present embodiment relates to a piezocomposite produced by the third production method of the present invention.

The following description will depict a seventh embodiment of the present invention, while referring to FIGS. 17A to 17D.

Figure 17A:
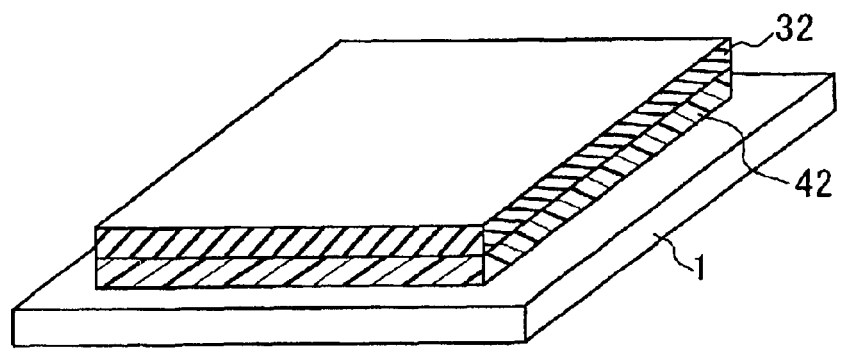
FIGS. 17A to 17D are schematic perspective views illustrating a production method according to a seventh embodiment of the present invention.
Figure 17B:
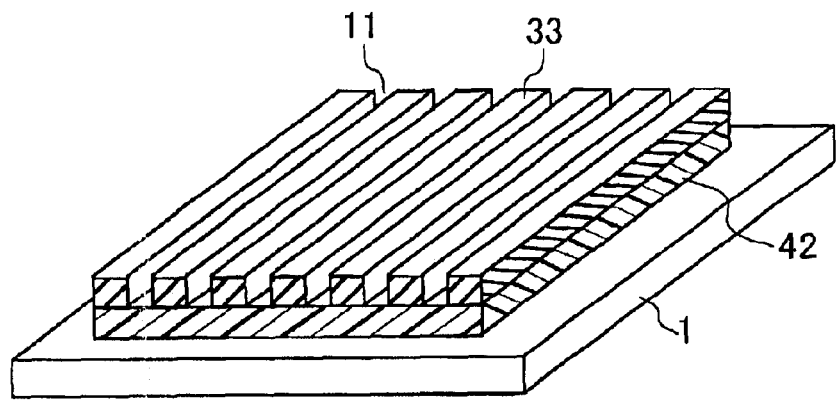

First of all, as steps of (a) preparing a sintered piezoelectric plate having a thickness ranging from 10 μm to 500 μm and (b) provisionally fixing the sintered piezoelectric plate on the substrate with an adhesive sheets, as shown in the schematic perspective view of FIG. 17A, a sintered piezoelectric plate containing PZT (lead zirconate titanate) as the principal component and having a size of 17 mm in vertical length×17 mm in horizontal length×0.05 mm in thickness as a sintered piezoelectric plate 32 was fixed provisionally on a glass plate (5 mm thick) as the substrate 1 with a thermal release sheet (Product No.: Rivalpha 3195M, manufactured by Nitto Denko Corporation) as an adhesive sheet 42.

Then, as a step (c) applied to the sintered piezoelectric plate provided with the resin layer for forming a plurality of parallel cut grooves without completely dividing the resin layer so as to cut the sintered piezoelectric plate into a plurality of sintered piezoelectric thin wires, 170 cut grooves, each having a width of 0.05 mm and a depth of 0.05 mm to 0.06 mm, were formed at intervals of 0.1 mm on the sintered piezoelectric plate provisionally fixed on the glass plate, using a dicing machine. As a result, as shown in the schematic perspective view of FIG. 17B, a glass plate is obtained on which 170 sintered piezoelectric thin wires, each having a width of 0.05 mm, a thickness of 0.05 mm, and a length of 17 mm, were carried on the thermal release sheet. 11 denotes a cut groove.

It should be noted that as a result of the foregoing machining, 170 sintered piezoelectric thin wires 33 were arranged in parallel at uniform intervals of 0.05 mm.

Figure 17C:
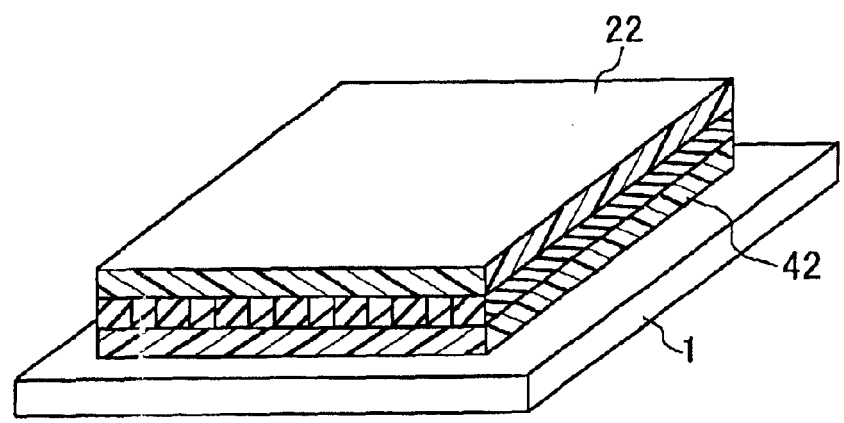

(d) Next, as a step of transferring the plurality of sintered piezoelectric thin wires provisionally fixed on the substrate onto a resin sheet as a resin layer, as shown in the schematic perspective view of FIG. 17C, two pieces of epoxy-base-resin adhesive sheets (Product No.: T2000 manufactured by Hitachi Chemical Co., Ltd.), each in a size of 17 mm in vertical length×17 mm in horizontal length×0.025 mm in thickness, were laminated over upper surfaces of the sintered piezoelectric thin wires 33 arranged and carried on the foregoing glass plate. Then, the lamination was heated at 120° C. for one hour while subjected to a pressure of 3 kg/cm². As a result of the heat treatment, a synergistic effect between the adhesion of the epoxy-base-resin adhesive sheet with the thin-line-form sintered piezocomposite pieces and a separation of the glass plate from the sintered piezoelectric thin wires due to the foaming of the thermal release sheet caused the sintered piezoelectric thin wires to be transferred onto the epoxy-base-resin adhesive sheet as the resin layer 22.

Figure 17D:
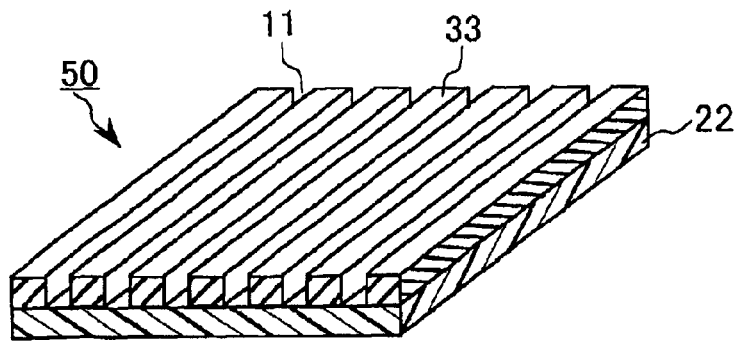

Consequently, a composite sheet unit 50 as shown in the schematic perspective view of FIG. 17D was obtained.

Furthermore, as a result of the foregoing operations, 170 sintered piezoelectric thin wires 33 are arranged in parallel at uniform intervals of 0.05 mm, bonded onto the resin layer 22.

Then, the steps (a) to (d) were repeated a plurality of times, whereby 170 identical composite sheet units were obtained.

By integrating the 170 composite sheet units in the same manner as that in the fourth embodiment, a piezocomposite identical to that of the fourth embodiment was obtained; namely, a piezocomposite 6 was obtained in a cubic shape with each edge of 17 mm in length, in which 28900 (170×170) sintered piezoelectric thin wires, each having a width of 0.05 mm, a thickness of 0.05 mm, and a length of 17 mm, were carried fixedly at uniform intervals in parallel by the resin layers 22, as shown in the schematic perspective view of FIG. 12.

Then, by dividing the obtained lamination in the same manner as that in the fourth embodiment, a plurality of piezocomposite pieces identical to those of the fourth embodiment were obtained.

According to the present embodiment, it is possible to achieve an effect that the step of forming resin layers on sintered piezoelectric plate pieces beforehand can be omitted in the process of producing the composite sheet units, in addition to the effects achieved by the fourth to sixth embodiments described above. Furthermore, it is possible to prevent the damage that occurs to the sintered piezoelectric plate when a resin layer is formed thereon, thereby improving the manufacturing yield.

It should be noted that it is possible to form impregnated-cured-resin portions by the same method as that described with regard to the fifth embodiment, so as to achieve the same effect as that achieved in the fifth embodiment.

It should be noted that the composite sheet units obtained by the present embodiment may be laminated in the same manner as that in the sixth embodiment using another adhesive resin sheets so as to form a piezocomposite, whereby the same effect as that described with regard to the sixth embodiment can be achieved.

Eighth Embodiment

The present embodiment relates to a piezocomposite produced by the fourth production method of the present invention.

Figure 18A:
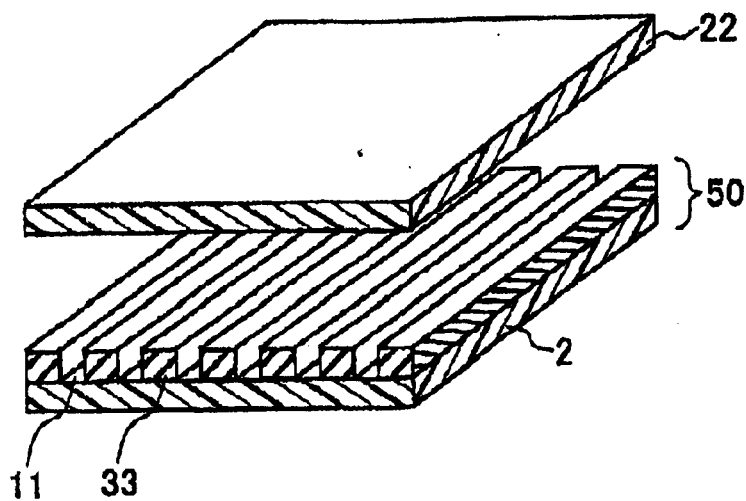
FIGS. 18A to 18C are schematic perspective views illustrating a production method according to an eighth embodiment of the present invention.
Figure 18B:
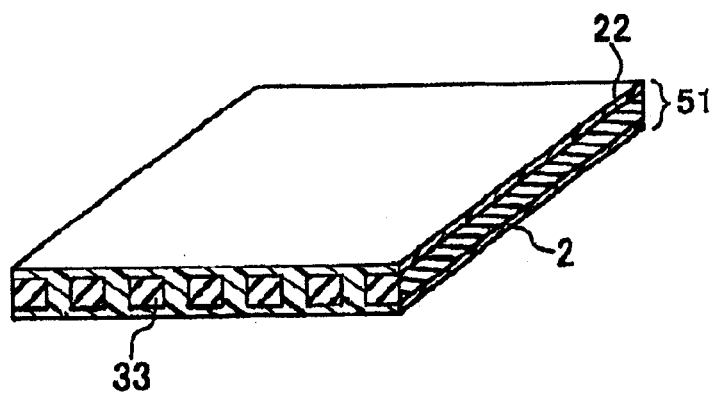
Figure 18C:
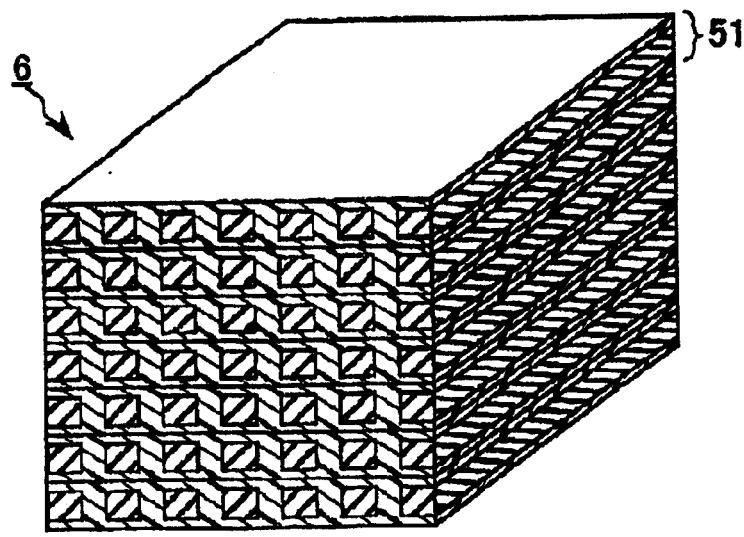

The following description will depict an eighth embodiment of the present invention, while referring to FIGS. 18A to 18C.

(a) First of all, composite sheet units 50 were obtained by the same method as that described with regard to the fourth embodiment. Namely, each composite sheet unit prepared was a composite sheet unit 50 in which 170 sintered piezoelectric thin wires, each having a width of 0.05 mm, a thickness of 0.05 mm, and a length of 17 mm, were arranged on a resin layer 2 in a size of 17 mm in vertical length×17 mm in horizontal length×0.05 mm in thickness. Then, as shown in the schematic perspective view of FIG. 18A, an epoxy resin layer in a size of 17 mm in vertical length×17 mm in horizontal length×0.025 mm in thickness as a resin layer 22, or more specifically, an epoxy-base-resin adhesive sheet (Product No.: T2000 manufactured by Hitachi Chemical Co., Ltd.), in a size of 17 mm in vertical length×17 mm in horizontal length×0.025 mm in thickness, was laminated over the sintered piezoelectric thin wires 33 arranged on the composite sheet unit 50.

As a step (b) of integrating the composite sheet unit and the resin layer so that the sintered piezoelectric thin wires of the composite sheet unit are interposed between the resin layer and the resin sheet so as to form a laminated composite sheet unit, the lamination was heated at 120° C. for one hour while a pressure of 10 kg/cm² was applied thereto from upper and lower surfaces thereof under vacuum (not more than 13.32 Pa (0.1 Torr)). As a result a laminated composite sheet unit 51 as shown in the schematic perspective view of FIG. 18B was obtained. The obtained laminated composite sheet unit approximately was in a size of 17 mm in vertical length×17 mm in horizontal length×0.100 mm in thickness, and contained, inside the resin layer 22, 170 sintered piezoelectric thin wires, each having a width of 0.05 mm, a thickness of 0.05 mm, and a length of 17 mm, arranged at uniform intervals of 0.05 mm.

(c) Then, the steps (a) and (b) were carried out a plurality of times, so as to obtain 170 of the foregoing laminated composite sheet units.

Next, as steps of (d) laminating the 170 laminated composite sheet units so that the sintered piezoelectric thin wires were arranged in parallel and (e) integrating the laminated composite sheet units, the lamination was heated at 170° C. for one hour while a pressure of 10 kg/cm$^2$ was applied thereto from upper and lower surfaces thereof under vacuum (not more than 13.32 Pa (0.1 Torr)), so that the lamination was integrated.

It should be noted that the integrated lamination was a piezocomposite 6 in a cubic shape with each edge of 17 mm in length, in which 28900 (170×170) sintered piezoelectric thin wires, each having a width of 0.05 mm, a thickness of 0.05 mm, and a length of 17 mm, were carried fixedly at uniform intervals in parallel by the resin layers 22, as shown in the schematic perspective view of FIG. 18C.

A piezocomposite obtained by laminating and integrating the laminated composite sheet units of the present invention basically does not contain void portions. Therefore, without impregnating and curing a resin after the integration of the lamination as in the method described with regard to the fifth embodiment, a piezocomposite that contains few void portions and thereby hardly is damaged upon cutting can be obtained readily. Therefore, it is possible to reduce the manufacturing cost.

It should be noted that by the method according to the present embodiment, any one of the composite sheet units obtained by the aforementioned methods can be used. In the description of the present embodiment, though a case of using the composite sheet unit obtained by the method according to the fourth method is described, a composite sheet unit having the thin-line-form sinter pieces 3 produced by the sintering on the substrate as described with regard to the first embodiment, or a composite sheet unit produced by the method described with regard to the seventh embodiment can be utilized.

Ninth and tenth embodiments described below relate to a piezocomposite produced by the fifth production method of the present invention.

Ninth Embodiment

As a step (a) of preparing two composite sheet units, composite sheet units were produced by the same method as that of the seventh embodiment except for the size.

Figure 19A:
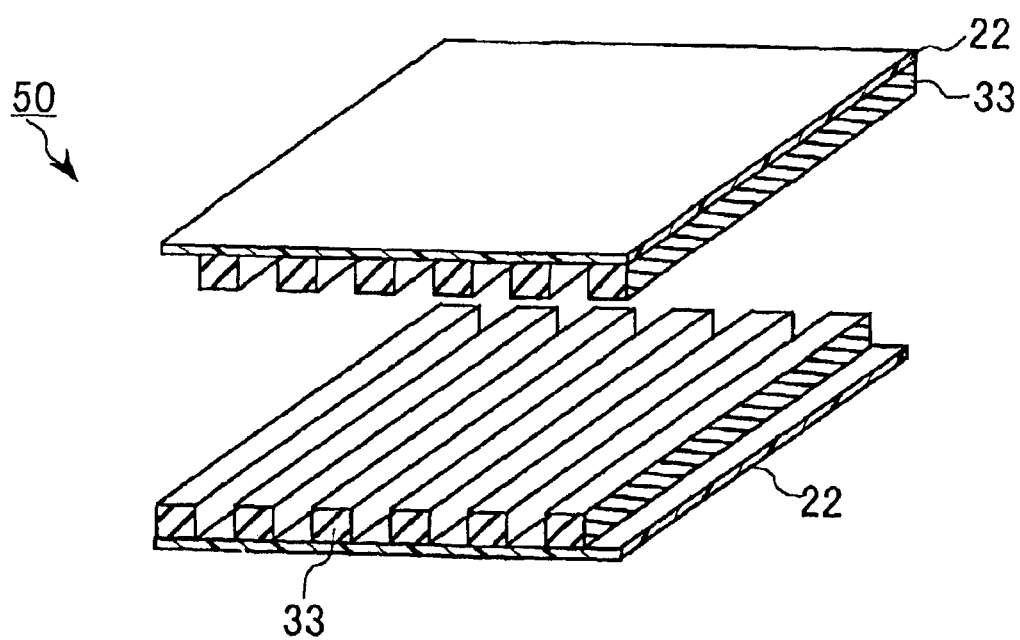
FIGS. 19A and 19B are schematic perspective views illustrating a production method according to a ninth embodiment of the present invention.

More specifically, a sintered piezoelectric plate containing PZT (lead zirconate titanate) as the principal component and having a size of 17 mm in vertical length×17 mm in horizontal length×0.05 mm in thickness as a sintered piezoelectric plate 32 was fixed provisionally on a glass plate (5 mm thick) as the substrate 1 with a thermal release sheet (Product No.: Rivalpha 3195M, manufactured by Nitto Denko Corporation) as an adhesive sheet 42. Then, cut grooves, each having a width of 0.07 mm and a depth of 0.05 mm to 0.06 mm, were formed at intervals of 0.12 mm on the sintered piezoelectric plate provisionally fixed on the glass plate, using a dicing machine. Consequently, the sintered piezoelectric plate is divided into 142 sintered piezoelectric thin wires with a width of 0.05 mm, which were arranged at uniform intervals of 0.07 mm (=0.12–0.05 mm) in parallel. Over the 142 sintered piezoelectric thin wires provisionally fixed in the substrate, a resin sheet (an epoxy-base-resin adhesive sheet in a size of 17 mm in vertical length×17 mm in horizontal length×0.025 mm in thickness, Product No.: T2000, manufactured by Hitachi Chemical Co., Ltd.) as a resin layer was provided, and the lamination was heated at 120° C for one hour while subjected to a pressure of 3 kg/cm$^2$, for thermal transfer of the sintered piezoelectric thin wires. Consequently, a composite sheet unit 50 as shown in the schematic perspective view of FIG. 19A was obtained.

Figure 19B:
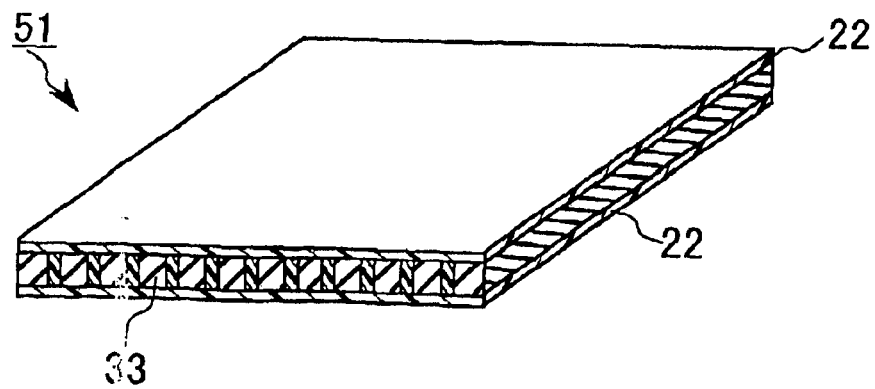

(b) The foregoing two composite sheet units 50 were provided so that the sintered piezoelectric thin wires arranged on a surface of one of the same were positioned between the sintered piezoelectric thin wires arranged on a surface of the other of the same, and in this state they were integrated, so that a laminated composite sheet unit was formed. More specifically, it was heated at 120° C. for one hour while a pressure of 10 kg/cm$^2$ was applied to the same from the upper and lower surfaces, so that they were integrated. As a result, a laminated composite sheet unit 51 as shown in the schematic perspective view of FIG. 19B was obtained. The obtained laminated composite sheet unit approximately was in a size of 17 mm in vertical length×17 mm in horizontal length×0.100 mm in thickness, and contained 284 (=142×2) sintered piezoelectric thin wires, each having a width of 0.05 mm, a thickness of 0.05 mm, and a length of 17 mm, arranged at uniform intervals of 0.01 mm inside the resin layer 22.

(c) Then, the steps (a) and (b) were carried out repeatedly a plurality of times, so as to obtain 170 of the foregoing laminated composite sheet units.

Next, as steps of (d) laminating the 170 laminated composite sheet units so that the sintered piezoelectric thin wires were arranged in parallel and (e) integrating the laminated composite sheet units, the lamination was heated at 170° C. for one hour while a pressure of 10 kg/cm$^2$ was applied thereto from upper and lower surfaces under vacuum (not more than 13.32 Pa (0.1 Torr)), so that the lamination was integrated.

Figure 20:
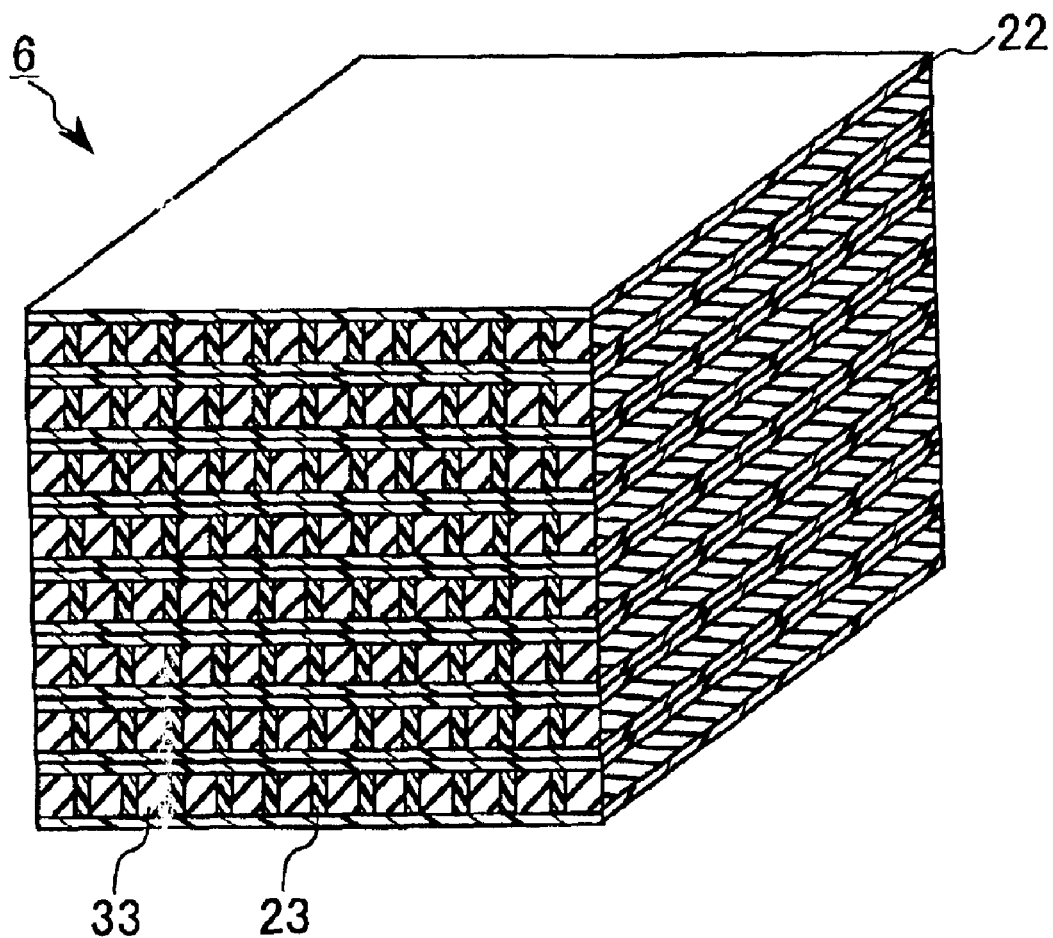
FIG. 20 is a schematic perspective and cross-sectional view illustrating a piezocomposite according to the ninth embodiment of the present invention.

The lamination obtained as a result was a piezocomposite 6 in a cubic shape with each edge of 17 mm in length, in which 48280 (284×170) sintered piezoelectric thin wires, each having a width of 0.05 mm, a thickness of 0.05 mm, and a length of 17 mm, were carried fixedly at uniform intervals in parallel by the resin layers 22, as shown in the schematic perspective view of FIG. 20.

Further, by dividing the obtained lamination by the same method as that in the fourth embodiment, a plurality of piezocomposite pieces identical to those in the fourth embodiment were obtained.

While achieving the same effects as those in the fourth through seventh embodiments, the present embodiment further allows the intervals between the sintered piezoelectric thin wires to be further decreased.

Considering the processing for providing the cut grooves 11 with a smaller width in the very thin sintered piezoelectric as described above by the current machining technology, the width of the cut groove has a limit of approximately 0.04 mm, or if it possibly has a smaller width, a significant decrease in the yield is presumed. Therefore, by the methods of the fourth to seventh embodiments, it necessarily is difficult to decrease the intervals between the sintered piezoelectric thin wires in the piezocomposite to not more than the foregoing limit of 0.04 mm.

However, by the method of the present embodiment in which two composite sheet units having cut grooves with relatively greater widths (0.07 mm in the present embodiment) are provided to face each other and are integrated so that sintered piezoelectric thin wires of one of the composite sheet unit can be located between the cut grooves in the other composite sheet unit. Therefore, consequently, a piezocomposite in which the sintered piezoelectric thin wires are arranged at narrower intervals (approximately 0.01 mm in the present embodiment) can be produced.

It should be noted the composite sheet unit used in the present embodiment is not limited to that of the seventh embodiment, but any composite sheet unit produced according to the other embodiments may be used.

It should be noted that, to form a piezocomposite, a plurality of the laminated composite sheet units obtained in the present embodiment may be laminated using another adhesive resin sheets in the same manner as that in the sixth embodiment. By so doing, the same effects as those described with regard to the sixth embodiment can be achieved.

Tenth Embodiment

With respect to a piezocomposite that was obtained using the same materials and by the same method as those in the ninth embodiment and that was in a state before cutting, resin-impregnated-cured portions were formed using the materials and method as those described with regard to the fifth embodiment. More specifically, an epoxy resin (Araldite Standard: Ciba-Geigy Co., Ltd.) was impregnated into void portions in the composite lamination 5 obtained in the same manner as that in the fifth embodiment, under vacuum (not more than 13.32 Pa (0.1 Torr)). Then, it was left to stand at normal temperature for 12 hours so that the resin was cured to form resin-impregnated-cured portions.

Achieving the effects described with regard to the ninth embodiment, the present embodiment further achieves the effects described with regard to the fifth embodiment.

It should be noted that in any one of the foregoing embodiments, the method of integrating a plurality of the aforementioned composite sheet units or a plurality of the aforementioned laminated composite sheet units may be the method of impregnating a resin in between the respective composite sheet units or the respective laminated composite sheet units and curing the same. Furthermore, with a view to further securing the integration, the piezocomposite obtained in any one of the aforementioned embodiments may be subjected further to a step of impregnating a resin in between the respective composite sheet units or the respective laminated composite sheet units and curing the same.

Eleventh Embodiment

Figure 21A:
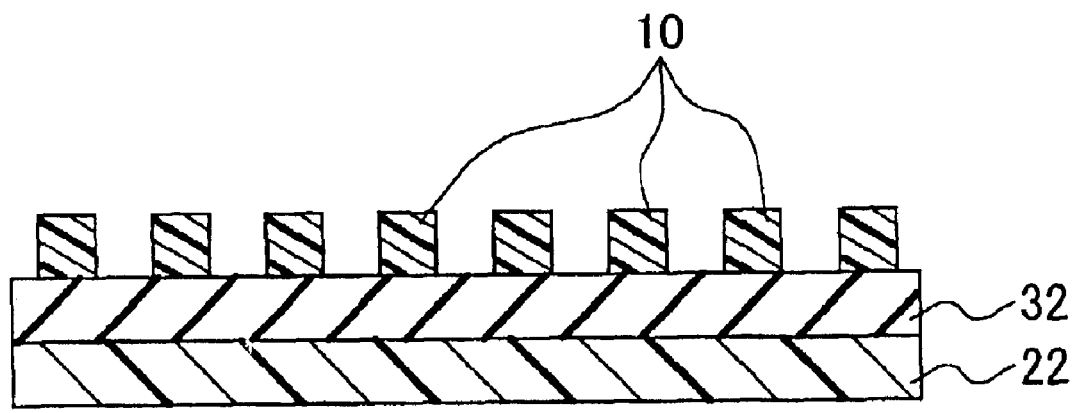
FIG. 21A is a schematic cross-sectional view illustrating a method for producing a composite sheet unit according to an eleventh embodiment of the present invention.
Figure 21B:
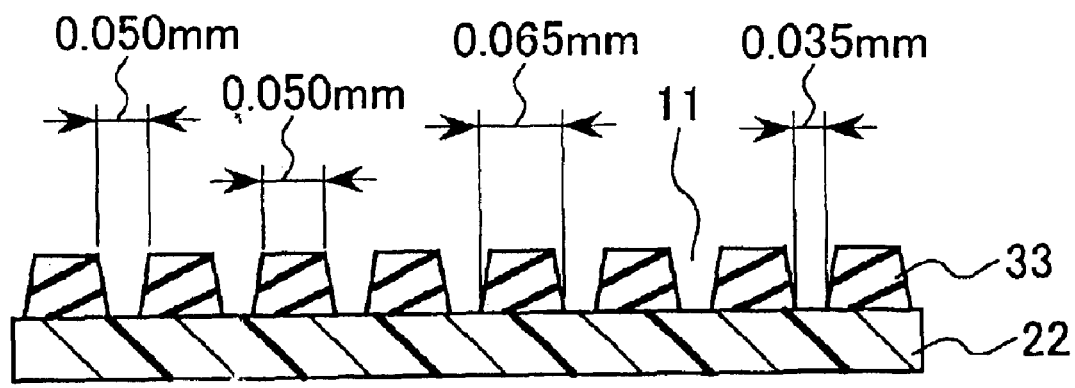
FIG. 21B is a schematic cross-sectional view illustrating the composite sheet unit.

The following description will depict an eleventh embodiment in detail, while referring to FIGS. 21A and 21B.

The eleventh embodiment basically is identical to the above-described fourth through tenth embodiments except that the sand-blasting is applied for forming the cut grooves in the step (c) of forming a plurality of cut grooves parallel with each other in the sintered piezoelectric plate so as to cut the sintered piezoelectric plate into a plurality of sintered piezoelectric thin wires.

First of all, as steps of (a) preparing a sintered piezoelectric plate having a thickness ranging from 10 $\mu$m to 500 $\mu$m and (b) forming a resin layer on the sintered piezoelectric plate, an epoxy resin layer in a size of 17 mm in vertical length×17 mm in horizontal length×0.05 mm in thickness was formed on a sintered piezoelectric plate containing PZT (lead zirconate titanate) as the principal component and having a size of 17 mm in vertical length×17 mm in horizontal length×0.05 mm in thickness as a sintered piezoelectric plate 32, as shown in the schematic perspective view of FIG. 10. More specifically, two epoxy-base-resin adhesive sheets (Product No.: T2000, manufactured by Hitachi Chemical Co., Ltd.), each in a size of 17 mm in vertical length×17 mm in horizontal length×0.025 mm in thickness, were laminated on one side of the aforementioned sintered piezoelectric plate, and the lamination was heated at 120° C. for one hour while subjected to a pressure of 10 kg/cm$^2$ under vacuum (not more than 13.32 Pa (0.1 Torr)). By so doing, the foregoing resin adhesive sheets were bonded on the sintered piezoelectric plate, so as to form a resin layer.

Then, as a step (c), applied to the sintered piezoelectric plate provided with the resin layer, of forming a plurality of parallel cut grooves without completely dividing the resin layer so as to cut the sintered piezoelectric plate into a plurality of sintered piezoelectric thin wires, the sand-blasting technique was used to form the cut grooves 11.

More specifically, 0.050 mm wide resist layers 10 were provided at intervals of 0.050 mm (i.e., pitch: 0.10 mm) on a surface of the sintered piezoelectric plate 32 having a resin layer 22, as shown in FIG. 21A. More specifically, approximately 170 of the resist layers 10, each in a size of 0.05 mm in width×17 mm in length, were provided in parallel at intervals of 0.05 mm on a 17 mm square sintered piezoelectric plate.

Subsequently, by blowing a fine ceramic powder thereto through openings between the resist layers 10 (from the upper side viewed in the drawing), cut grooves 11 were formed in the sintered piezoelectric, at positions where the resist layers 10 were not provided.

As a result of the sand-blasting, a composite sheet unit was obtained, composed of 170 sintered piezoelectric thin wires, each having a trapezoidal cross section with a top side of approximately 0.05 mm, a bottom side of approximately 0.065 mm, and a height of 0.05 mm, and the resin layer in a size of 17 mm in vertical length×17 mm in horizontal length×0.05 mm in thickness, as shown in FIG. 21B. 11 denotes a cut groove.

As a result of the sand blasting, the 170 sintered piezoelectric thin wires 33 were arranged in parallel at uniform intervals of approximately 0.05 mm in average (approximately 0.035 mm where the space therebetween was narrower, and approximately 0.065 mm where the space therebetween was wider), with their lower surfaces being bonded onto and carried by the resin layer 22.

Subsequently, the steps (a) to (c) were carried out repeatedly a plurality of times, so as to obtain 170 of the foregoing composite sheet units.

Next, as steps of (e) laminating a plurality of the foregoing composite sheet units so that the sintered piezoelectric thin wires were positioned between the resin layers and (e) integrating the laminated plural composite sheet units, 170 of the foregoing composite sheet units were laminated so that the sintered piezoelectric thin wires were directed in parallel, and on top of the same, two epoxy-base-resin adhesive sheets (Product No.: T2000, manufactured by Hitachi Chemical Co., Ltd.), each in a size of 17 mm in vertical length×17 mm in horizontal length×0.025 mm in thickness, were laminated. Then, the lamination was heated at 170° C. for one hour while subjected to a pressure of 10 kg/cm$^2$ under vacuum (not more than 13.32 Pa (0.1 Torr)), so that the lamination was integrated.

It should be noted that the lamination thus integrated was a piezocomposite in a cubic shape with each edge of 17 mm in length, in which 28900 (170×170) sintered piezoelectric thin wires, each of which had a trapezoidal cross section with a top side of approximately 0.05 mm, a bottom side of approximately 0.065 mm, and a height of 0.05 mm, and had a length of approximately 17 mm, were carried fixedly by the resin layers 22, in parallel at uniform intervals of approximately 0.05 mm in average (approximately 0.035 mm where the space therebetween was narrower, and approximately 0.065 mm where the space therebetween was wider).

(g) Next, as a step of cutting the lamination in a direction crossing the lengthwise direction of the sintered piezoelectric thin wires, the lamination obtained through the aforementioned steps was divided into a plurality of pieces along planes crossing the lengthwise direction of the sintered piezoelectric thin wires in the lamination. More specifically, by cutting the same with a wire saw, the thickness of the piezocomposite was controlled desirably. By slicing the integrated piezocomposite 6 in the thickness direction, the piezocomposite was divided into a plurality of piezocomposite pieces 9 with desired thicknesses, as shown in the schematic perspective view of FIG. 13.

According to the production method of the present invention, the piezocomposite 6 can be obtained by integrating a desired number of the composite sheet units in each of which a desired number of the sintered piezoelectric thin wires 33 in a desired size are provided at desired positions on the resin layer 22.

It should be noted that resin-impregnated-cured portions may be formed by the same method as that described with regard to the fifth embodiment in the piezocomposite obtained in the present embodiment before cutting and dividing, so that the same effects as those in the fifth embodiment can be achieved.

It should be noted that the composite sheet units obtained in the present embodiment may be laminated using other adhesive resin sheets so as to form a piezocomposite by the same method as that in the sixth embodiment. By so doing, the same effects as those described with regard to the sixth embodiment can be achieved.

According to the present embodiment, in addition to the effects achieved by the fourth to sixth embodiments, the following effect can be achieved. Namely, the processing is carried out more efficiently by using the sand-blasting, thereby allowing the manufacturing cost to be reduced.

Twelfth Embodiment

Having the configuration of the eleventh embodiment, a piezocomposite according to a twelfth embodiment of the present invention further contains resin-impregnated-cured portions between the sintered piezoelectric thin wires.

The production method shown in the eleventh embodiment further includes a step of impregnating a resin into void portions and curing the same, after the laminating and integrating steps. More specifically, the steps (a) to (f) in the fourth embodiment were carried out sequentially, and an epoxy resin (Araldite Standard: Ciba-Geigy Co., Ltd.) was impregnated into void portions in the obtained composite lamination, under vacuum (not more than 13.32 Pa (0.1 Torr)). Then, it was left to stand at normal temperature for 12 hours so that the resin was cured to form resin-impregnated-cured portions.

Furthermore, by the same method as that in the other embodiments, the thickness of the piezocomposite may be controlled desirably, by grinding or cutting the same.

Furthermore, by the same method as that in the other embodiments, the piezocomposite may be sliced in the thickness direction, so as to be divided into a plurality of piezocomposite pieces with desired thicknesses.

According to the twelfth embodiment of the present invention, in addition to the effects obtained by the eleventh embodiment, the following effects can be achieved. Namely, as a result of the impregnation and curing of a resin in void portions in the lamination so as to provide the resin-impregnated-cured portions, the falling off of the sintered piezoelectric thin wires, which tends to occur upon the grinding or the cutting and dividing, is suppressed, thereby allowing the manufacturing yield to be improved.

Furthermore, the provision of the resin-impregnated-cured portions allows desirable control of physical properties of the piezocomposite. It should be noted that the resin to be impregnated and cured is not limited to an epoxy resin, but it may be a silicon resin or an urethane resin. It may be selected desirably according to the density and acoustic velocity of the object piezocomposite.

EXAMPLES

Example 1

By cutting and grinding a piezocomposite obtained by the production method of the first embodiment, a piezocomposite in a size of 15 mm in vertical length×15 mm in horizontal length×0.3 mm in thickness (in the lengthwise direction of sintered piezoelectric thin wires) was obtained. More specifically, a 1-3 piezocomposite was obtained in the foregoing size in which approximately 12300 sintered piezoelectric thin wires, each in an average size of approximately 0.065 mm square×0.3 mm in length, were arranged at uniform intervals of 0.07 mm in a resin.

Example 2

By cutting and grinding a piezocomposite obtained by the production method of the fourth embodiment, a piezocomposite in a size of 15 mm in vertical length×15 mm in horizontal length×0.3 mm in thickness (in the lengthwise direction of sintered piezoelectric thin wires) was obtained. More specifically, a 1-3 piezocomposite was obtained in the foregoing size in which approximately 22500 sintered piezoelectric thin wires, each in an average size of approximately 0.05 mm square×0.3 mm in length, were arranged at uniform intervals of 0.05 mm in a resin and which contained void portions.

Example 3

By cutting and grinding a piezocomposite obtained by the production method of the fifth embodiment, a piezocomposite in a size of 15 mm in vertical length×15 mm in horizontal length×0.3 mm in thickness (in the lengthwise direction of sintered piezoelectric thin wires) was obtained. Therefore, this piezocomposite of Example 3 was the same 1-3 piezocomposite as that of Example 2 except that an epoxy resin was impregnated into the void portions and cured.

Example 4

The same production method as that in the fifth embodiment was used basically except that, in place of the epoxy resin, a silicone resin (CY52-227A/B manufactured by Dow Corning Toray Silicone Co., Ltd.) was impregnated into the void portions under vacuum (not more than 13.32 Pa (0.1 Torr)) and cured through a heat treatment at 150° C. for one hour, thereby forming the resin-impregnated-cured portions. In other words, this piezocomposite of Example 4 was the same as the 1-3 piezocomposite of Example 2 except that the silicone resin was impregnated into the void portions.

Example 5

By cutting and grinding a piezocomposite obtained by the production method of the sixth embodiment, a piezocomposite in a size of 15 mm in vertical length×15 mm in horizontal length×0.3 mm in thickness (in the lengthwise direction of sintered piezoelectric thin wires) was obtained. This piezocomposite of Example 5 was the same 1-3 piezocomposite as that of Example 2 except that adhesive resin sheets different from those of the resin layers in the composite sheet units were used before the lamination and integration of the composite sheet units. More specifically, it was a 1-3 piezocomposite in the foregoing size in which approximately 22500 sintered piezoelectric thin wires, each in an average size of approximately 0.05 mm square×0.3 mm in length, were arranged at uniform intervals of 0.05 mm in a resin and which contained void portions. Namely, it was identical in the form to that of Example 2.

Example 6

By cutting and grinding a piezocomposite obtained by the production method of the seventh embodiment, a piezocomposite in a size of 15 mm in vertical length×15 mm in horizontal length×0.3 mm in thickness (in the lengthwise direction of sintered piezoelectric thin wires) was obtained. This piezocomposite of Example 6 was the same 1-3 piezocomposite as that of Example 2 except that upon producing composite sheet units, the sintered piezoelectric thin wires provisionally fixed on the substrate were transferred onto resin sheets. More specifically, it was a 1-3 piezocomposite in the foregoing size in which approximately 22500 sintered piezoelectric thin wires, each in an average size of approximately 0.05 mm square×0.3 mm in length, were arranged at uniform intervals of 0.05 mm in a resin and which contained void portions. Namely, it was identical in the form to that of Example 2.

Example 7

By cutting and grinding a piezocomposite obtained by the production method of the eighth embodiment, a piezocomposite in a size of 15 mm in vertical length×15 mm in horizontal length×0.3 mm in thickness (in the lengthwise direction of sintered piezoelectric thin wires) was obtained. This piezocomposite of Example 7 was characterized in that a plurality of laminated composite sheet units, each integrally provided, were laminated and integrated. It had an internal structure (the number and arrangement of sintered piezoelectric thin wires) identical to that of Example 2, but instead of containing void portions, it was filled with an epoxy resin used as the resin layers.

Example 8

By cutting and grinding a piezocomposite obtained by the production method of the ninth embodiment, a piezocomposite in a size of 15 mm in vertical length×15 mm in horizontal length×0.3 mm in thickness (in the lengthwise direction of sintered piezoelectric thin wires) was obtained. More specifically, a 1-3 piezocomposite was obtained in the foregoing size in which approximately 37500 sintered piezoelectric thin wires, each in an average size of approximately 0.05 mm square×0.3 mm in length, were arranged at uniform intervals in a horizontal direction (direction in which the sintered piezoelectric thin wires were arranged in the composite sheet unit) of 0.01 mm in average and at uniform intervals in a vertical direction (direction in which the composite sheet units were laminated) of 0.05 mm in a resin and which contained void portions.

Example 9

By cutting and grinding a piezocomposite obtained by the production method of the tenth embodiment, a piezocomposite in a size of 15 mm in vertical length×15 mm in horizontal length×0.3 mm in thickness (in the lengthwise direction of sintered piezoelectric thin wires) was obtained. Therefore, this piezocomposite of Example 9 was the same 1-3 piezocomposite as that of Example 8 except that an epoxy resin was impregnated into the void portions and cured.

Example 10

By cutting and grinding a piezocomposite obtained by the production method of the eleventh embodiment, a piezocomposite in a size of 15 mm in vertical length×15 mm in horizontal length×0.3 mm in thickness (in the lengthwise direction of sintered piezoelectric thin wires) was obtained. In other words, it was a 1-3 piezocomposite in the foregoing size in which 28900 (170×170) sintered piezoelectric thin wires, each of which had a trapezoidal cross section with a top side of approximately 0.05 mm, a bottom side of approximately 0.065 mm, and a height of 0.05 mm, and had a length of approximately 17 mm, were carried fixedly in a resin at uniform intervals of approximately 0.05 mm in average (approximately 0.035 mm where the space therebetween was narrower, and approximately 0.065 mm where the space therebetween was wider). Furthermore, the 1-3 piezocomposite had void portions.

Example 11

By cutting and grinding a piezocomposite obtained by the production method of the twelfth embodiment, a piezocomposite in a size of 15 mm in vertical length×15 mm in horizontal length×0.3 mm in thickness (in the lengthwise direction of sintered piezoelectric thin wires) was obtained. Therefore, this piezocomposite of Example 11 was the same 1-3 piezocomposite as that of Example 10 except that an epoxy resin was impregnated into the void portions and cured.

Comparative Example

Physical properties of PZT (lead zirconate titanate) that was used as the sintered piezoelectric plate in Examples 2 to 11 are shown.

Eleven kinds of the above-described piezocomposites thus obtained had the same outer size (15 mm in vertical length×15 mm in horizontal length×0.3 mm in thickness).

Respective densities of the obtained piezocomposites were derived from the sizes and weights of the piezocomposites.

Gold was deposited on both sides (on surfaces perpendicular to the lengthwise direction of the sintered piezoelectric thin wires) of each of the foregoing eleven piezocomposites to a thickness of 0.2 $\mu$m by using a sputtering device, so as to form electrodes.

Then, a voltage of 250 V was applied across the electrodes on the both sides in an ambient atmosphere at 170° C. for 30 minutes for polarization, so that elements for measurement were obtained.

Frequency characteristics of the foregoing obtained measurement-use elements were measured and evaluated, so that their physical properties such as densities and electromechanical coupling factors (Kt) were calculated.

Furthermore, a PZT volume occupancy in each piezocomposite (a percentage of the volume of PZT in the entire volume of the piezocomposite) is shown as well.

The physical properties of the piezocomposites of Examples 1 to 11 and Comparative Example are shown in Table 1 below.

TABLE 1

| | DENSITY (g/cm²) | ELECTRO-MECHANICAL COUPLING FACTOR kt(-) | PZT VOLUME OCCUPANCY (-) |
|---|---|---|---|
| EX. 1 | 2.25 | 0.62 | 0.23 |
| EX. 2 | 2.50 | 0.70 | 0.25 |
| EX. 3 | 2.78 | 0.65 | 0.25 |
| EX. 4 | 2.81 | 0.68 | 0.25 |
| EX. 5 | 2.48 | 0.66 | 0.25 |
| EX. 6 | 2.50 | 0.68 | 0.25 |
| EX. 7 | 2.75 | 0.66 | 0.25 |
| EX. 8 | 3.68 | 0.65 | 0.42 |
| EX. 9 | 3.71 | 0.64 | 0.42 |
| EX. 10 | 2.71 | 0.69 | 0.29 |
| EX. 11 | 2.93 | 0.69 | 0.29 |
| COM. EX. (PZT) | 7.7 | 0.50 | — |

As seen in Table 1, the piezocomposites of the present invention had improved electromechanical coupling factors, as compared with the Comparative Example. Further, as seen in Table 1, according to the production method of the present invention, the density of the piezocomposite can be controlled in a wide range, since the PZT volume occupancy in the piezocomposite can be controlled freely in a wide range.

Example 12

Figure 22:
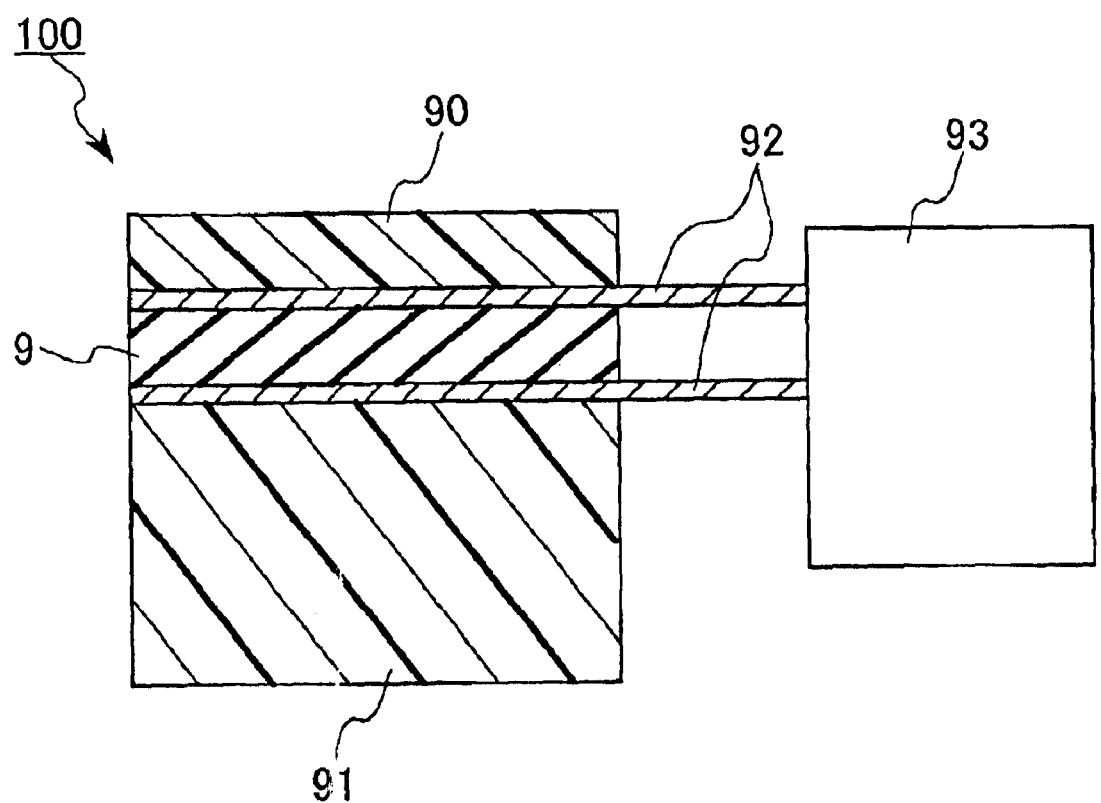
FIG. 22 is a view illustrating a configuration of an ultrasonic probe for an ultrasonic diagnostic equipment according to Example 12 of the present invention.

In piezocomposites having electromechanical coupling factors kt of 0.69, among the piezocomposites 9 obtained according to the present invention, an acoustic matching layer 90 made of a silicone resin and a ceramic filler was provided on an ultrasonic radiation surface, while a backing member 91 made of an iron powder and a rubber was provided on the other surface, as shown in FIG. 22. Further, among the electrodes 92 provided on both surfaces of the piezocomposite, one electrode on the ultrasonic radiation surface of the piezocomposite 9 was grounded, while the other electrode was connected with a transmitting/receiving circuit 93, as a driving electrode.

An ultrasonic probe 100 thus configured provided an approximately 50% wider band, as compared with an ultrasonic probe with a similar configuration except that a piezoelectric ceramic having an electromechanical coupling factor kt of 0.50 was used in place of the piezocomposite 9.

Example 13

The present example was an ultrasonic diagnostic equipment utilizing the piezocomposite of the present invention described with regard to Example 12.

Figure 23:
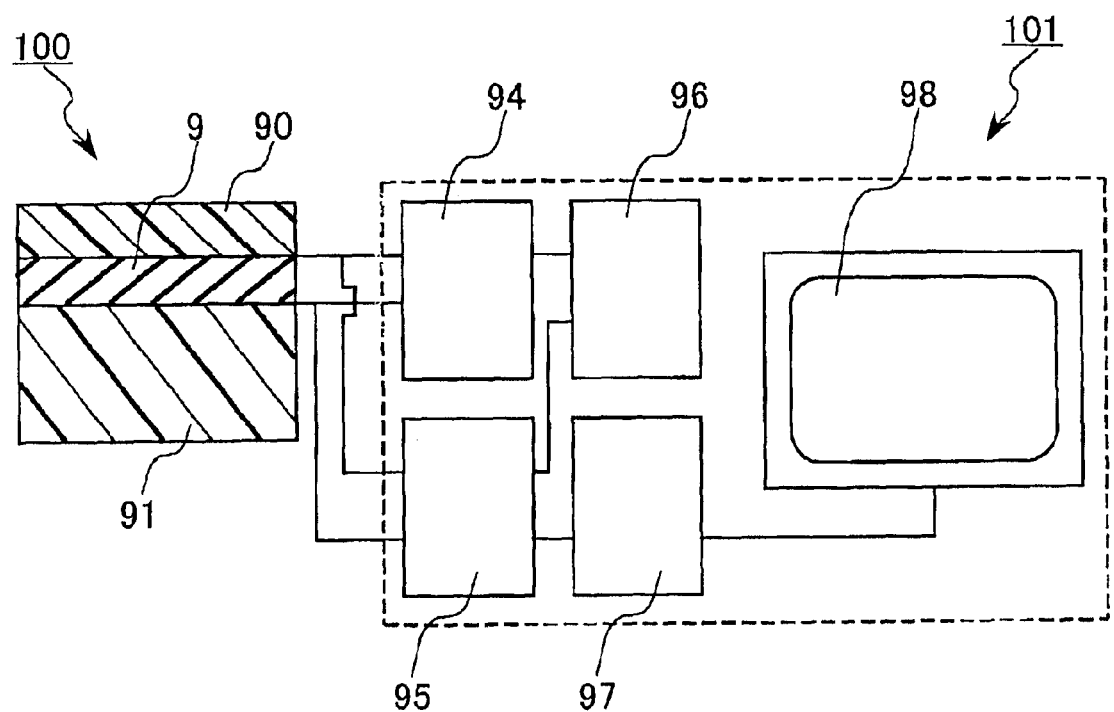
FIG. 23 is a view illustrating a configuration of an ultrasonic diagnostic equipment according to Example 13 of the present invention.
Figure 24:
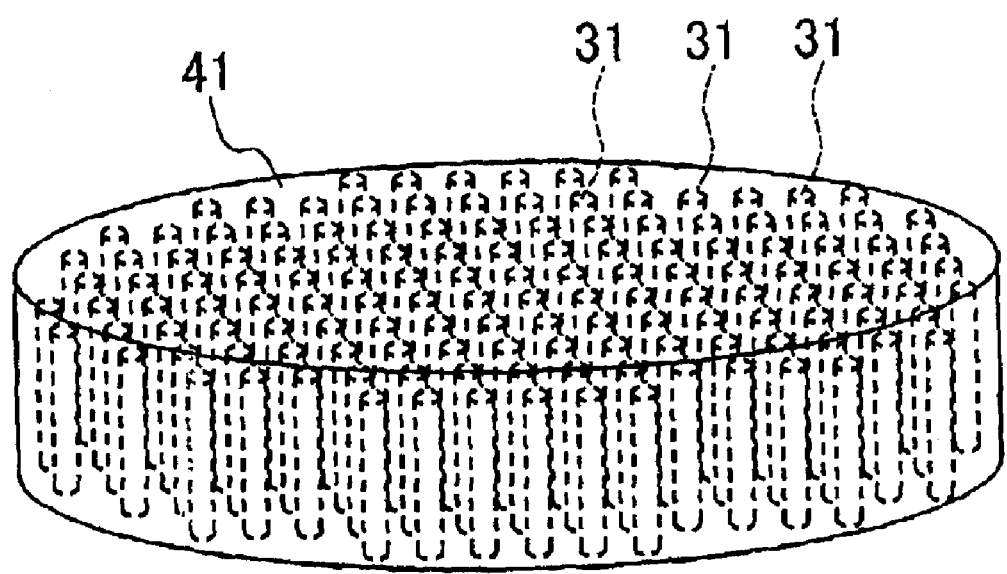
FIG. 24 is a schematic perspective view illustrating a conventional 1-3 piezocomposite.

As shown in FIG. 23, the ultrasonic probe 100 of Example 12 was connected with an ultrasonic diagnostic equipment main body 101 composed of a transmitting section 94, a receiving section 95, a controlling section 96, an image forming section 97, and an image display device 98. An ultrasonic diagnostic equipment was obtained that was capable of providing higher resolution because of the effect of the ultrasonic probe that provided approximately 50% wider band as compared with the conventional cases.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A piezocomposite, obtained by laminating and integrating a plurality of composite sheet units, each of which includes a resin layer and a plurality of sintered piezoelectric thin wires arranged in a uniform direction on a surface of the resin layer, so that the sintered piezoelectric thin wires are positioned between the resin layers, and cutting the same in a direction perpendicular to a lengthwise direction of the sintered piezoelectric thin wires.

wherein in each of the composite sheet units, the sintered piezoelectric thin wires are arranged on a surface of each resin layer so as to have void portions between adjacent ones of the sinterned piezoelectric thin wires, and the plurality of composite sheet units are laminated and the laminated composite sheets are integrated.

2. The piezocomposite according to claim 1, wherein the composite sheet unit includes two resin layers and a plurality of sintered piezoelectric thin wires arranged in a uniform direction between the two resin layers.

3. The piezocomposite according to claim 1, wherein resin-impregnated-cured portions are present between the sintered piezoelectric thin wires.

4. The piezocomposite according to claim 1, wherein each resin layer is composed of a plurality of constituent resin layers.

5. The piezocomposite according to claim 1, wherein each of the sintered piezoelectric thin wires is in a prismatic shape having a polygonal cross section with an average edge length of 10 μm to 500 μm and having a length of 0.05 mm to 3 mm.

6. The piezocomposite according to claim 5, wherein the prismatic shape with a polygonal cross section is a prismatic shape having a trapezoidal cross section.

7. The piezocomposite according to claim 1, wherein the number of the sintered piezoelectric thin wires arranged on one surface of the resin layer is in a range of 10 to 3000.

8. The piezocomposite according to claim 1, wherein the number of the laminated resin layers is in a range of 20 to 1500.

9. The piezocomposite according to claim 1, wherein the number of the sintered piezoelectric thin wires arranged in a uniform direction in the piezocomposite is in a range of 200 to 4500000.

10. The piezocomposite according to claim 1, wherein a cut surface is ground.

11. The piezocomposite according to claim 1, wherein the sintered piezoelectric thin wires have cut surfaces in the lengthwise direction.

12. The piezocomposite according to claim 1, wherein resin-impregnated-cured portions are provided in the void-portions.

13. An ultrasonic probe for an ultrasonic diagnostic equipment, comprising:

a piezocomposite, obtained by laminating and integrating a plurality of composite sheet units, each of which includes a resin layer and a plurality of sintered piezoelectric thin wires arranged in a uniform direction on a surface of the resin layer, so that the sintered piezoelectric thin wires are positioned between the resin layers, and cutting the same in a direction perpendicular to a lengthwise direction of the sintered piezoelectric thin wires, wherein the plurality of composite sheet units are laminated and the laminated composite sheets are integrated;

electrodes provided on both sides of the piezocomposite;

an acoustic matching layer; and a backing member, wherein:

the piezocomposite is interposed between the acoustic matching layer and the backing member; and one of the electrodes is grounded, while the other electrode is connected as a driving electrode with a transmitting/receiving circuit.

14. An ultrasonic diagnostic equipment, comprising:

an ultrasonic diagnostic equipment main body; and an ultrasonic probe for an ultrasonic diagnostic equipment, connected with the ultrasonic diagnostic equipment main body, wherein:

the ultrasonic probe includes:

a piezocomposite, obtained by laminating and integrating a plurality of composite sheet units, each of which includes a resin layer and a plurality of sintered piezoelectric thin wires arranged in a uniform direction on a surface of the resin layer, so that the sintered piezoelectric thin wires are positioned between the resin layers, and cutting the same in a direction perpendicular to a lengthwise direction of the sintered piezoelectric thin wires, wherein the plurality of composite sheet units are laminated and the laminated composite sheets are integrated;

electrodes provided on both sides of the piezocomposite;

an acoustic matching layer; and a backing member, wherein:

the piezocomposite is interposed between the acoustic matching layer and the backing member; and one of the electrodes is grounded, while the other electrode is connected as a driving electrode with a transmitting/receiving circuit;

and, the ultrasonic diagnostic equipment main body includes:

a transmitting section and a receiving section that are connected with lines lead from the electrodes on the both sides;

a controlling section connected with the transmitting section and the receiving section;

an image forming section connected with the receiving section and the controlling section; and an image display device connected with the image forming section.

15. A piezocomposite comprising a plurality of composite sheet units, each of which includes a resin layer and a plurality of sintered piezoelectric thin wires arranged in a uniform direction on a surface of the resin layer, so that the sintered piezoelectric thin wires are positioned between the resin layers, and cutting the same in a direction perpendicular to a lengthwise direction of the sintered piezoelectric thin wires, wherein the plurality of composite sheet units are laminated and the laminated composite sheet are integrated.

* * * * *

UNITED STATES PATENT AND TRADEMARK OFFICE
CERTIFICATE OF CORRECTION

PATENT NO. : 6,873,090 B2
DATED : March 29, 2005
INVENTOR(S) : Shiraishi et al.

It is certified that error appears in the above-identified patent and that said Letters Patent is hereby corrected as shown below:

Column 34,
Line 9, "thin wires." should read -- thin wires, --.

Signed and Sealed this

Twenty-fourth Day of January, 2006

JON W. DUDAS
*Director of the United States Patent and Trademark Office*